US010367092B2

(12) United States Patent
Wakimoto et al.

(10) Patent No.: US 10,367,092 B2
(45) Date of Patent: *Jul. 30, 2019

(54) SILICON CARBIDE SEMICONDUCTOR DEVICE AND METHOD OF MANUFACTURING SILICON CARBIDE SEMICONDUCTOR DEVICE

(71) Applicant: FUJI ELECTRIC CO., LTD., Kawasaki-shi, Kanagawa (JP)

(72) Inventors: Setsuko Wakimoto, Matsumoto (JP); Masanobu Iwaya, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 197 days.

This patent is subject to a terminal disclaimer.

(21) Appl. No.: 15/397,677

(22) Filed: Jan. 3, 2017

(65) Prior Publication Data

US 2017/0222046 A1 Aug. 3, 2017

(30) Foreign Application Priority Data

Feb. 1, 2016 (JP) .................................. 2016-017568
Aug. 25, 2016 (JP) .................................. 2016-165171

(51) Int. Cl.
*H01L 21/46* (2006.01)
*H01L 29/78* (2006.01)
(Continued)

(52) U.S. Cl.
CPC ........ *H01L 29/7827* (2013.01); *H01L 21/046* (2013.01); *H01L 21/26513* (2013.01);
(Continued)

(58) Field of Classification Search
CPC ......... H01L 21/02378; H01L 21/02529; H01L 21/02376; H01L 21/02527; H01L 21/046;
(Continued)

(56) References Cited

U.S. PATENT DOCUMENTS 5,233,215 A    8/1993 Baliga
5,963,807 A   10/1999 Ueno
(Continued)

FOREIGN PATENT DOCUMENTS

JP    2009-283540 A    12/2009
JP    2012-069933 A     4/2012
(Continued)

*Primary Examiner* — (Vikki) Hoa B Trinh
(74) *Attorney, Agent, or Firm* — Rabin & Berdo, P.C.

(57) ABSTRACT

In a vertical MOSFET of a trench gate structure, a high-concentration implantation region is provided in a p-type base region formed from a p-type silicon carbide layer formed by epitaxial growth, so as to include a portion in which a channel is formed. The high-concentration implantation region is formed by ion implantation of a p-type impurity into the p-type silicon carbide layer. The high-concentration implantation region is formed by p-type ion implantation and has an impurity concentration profile in which concentration differences in a depth direction form a bell-shaped curve at a peak of impurity concentration that is higher than that of the p-type silicon carbide layer. In the p-type base region, disorder occurs partially in the crystal structure consequent to the ion implantation for forming the high-concentration implantation region.

20 Claims, 25 Drawing Sheets

(51) Int. Cl.
*H01L 21/265* (2006.01)
*H01L 29/16* (2006.01)
*H01L 29/423* (2006.01)
*H01L 29/66* (2006.01)
*H01L 21/04* (2006.01)

(52) U.S. Cl.
CPC ...... *H01L 29/1608* (2013.01); *H01L 29/4236* (2013.01); *H01L 29/66068* (2013.01); *H01L 29/66666* (2013.01)

(58) Field of Classification Search
CPC .......... H01L 21/26513; H01L 29/1608; H01L 29/1602; H01L 29/161; H01L 29/165; H01L 29/66666; H01L 29/4236; H01L 29/66068; H01L 29/7827
See application file for complete search history.

(56) References Cited

U.S. PATENT DOCUMENTS

| | | | |
|---|---|---|---|
| 6,495,871 | B2 | 12/2002 | Hattori et al. |
| 7,626,231 | B1 | 12/2009 | Hsieh |
| 7,687,851 | B2 | 3/2010 | Hshieh |
| 7,855,412 | B2 | 12/2010 | Matsuki et al. |
| 8,564,054 | B2 | 10/2013 | Hsieh |
| 8,921,211 | B2 | 12/2014 | Frisina et al. |
| 9,064,710 | B2 | 6/2015 | Zhang et al. |
| 9,099,320 | B2 | 8/2015 | Hsieh |
| 9,136,372 | B2 | 9/2015 | Miyahara et al. |
| 9,614,071 | B2 | 4/2017 | Sugimoto et al. |
| 9,620,358 | B2 | 4/2017 | Tamaso |
| 9,997,358 | B2 | 6/2018 | Wakimoto et al. |
| 2006/0054970 | A1 | 3/2006 | Yanagida et al. |
| 2008/0230787 | A1 | 9/2008 | Suzuki et al. |
| 2009/0280609 | A1 | 11/2009 | Akiba et al. |
| 2009/0286372 | A1 | 11/2009 | de Fresart et al. |
| 2009/0289264 | A1 | 11/2009 | Matsuki et al. |
| 2011/0068353 | A1 | 3/2011 | Nakano |
| 2012/0018800 | A1 | 1/2012 | Kim |
| 2012/0193643 | A1* | 8/2012 | Masuda .............. H01L 29/1095 257/77 |
| 2012/0280255 | A1 | 11/2012 | Masuda et al. |
| 2015/0035006 | A1 | 2/2015 | Yoshimochi |
| 2015/0084125 | A1 | 3/2015 | Pala et al. |
| 2016/0204206 | A1 | 7/2016 | Masuda et al. |
| 2016/0211334 | A1 | 7/2016 | Tanaka et al. |
| 2016/0247910 | A1 | 8/2016 | Suzuki et al. |
| 2016/0261150 | A1 | 9/2016 | Mizoguchi |
| 2016/0322227 | A1 | 11/2016 | Arai et al. |
| 2016/0336441 | A1 | 11/2016 | Nakano et al. |
| 2017/0033212 | A1 | 2/2017 | Siemieniec et al. |
| 2017/0141223 | A1 | 5/2017 | Hoshi |
| 2017/0221714 | A1* | 8/2017 | Wakimoto ........ H01L 21/26506 |
| 2017/0222046 | A1 | 8/2017 | Wakimoto et al. |
| 2018/0138264 | A1 | 5/2018 | Kinoshita |
| 2018/0138274 | A1 | 5/2018 | Ohse et al. |

FOREIGN PATENT DOCUMENTS

| | | |
|---|---|---|
| JP | 2012-099601 A | 5/2012 |
| JP | 2014-241435 A | 12/2014 |
| JP | 2015-072999 A | 4/2015 |
| JP | 5819064 B2 | 11/2015 |
| JP | 2016-0165171 A | 9/2016 |
| JP | 2016-165172 A | 9/2016 |

* cited by examiner

SILICON CARBIDE SEMICONDUCTOR DEVICE AND METHOD OF MANUFACTURING SILICON CARBIDE SEMICONDUCTOR DEVICE

CROSS REFERENCE TO RELATED APPLICATIONS

This application is based upon and claims the benefit of priority of the prior Japanese Patent Application Nos. 2016-017568 filed on Feb. 1, 2016, and 2016-165171 filed on Aug. 25, 2016, the entire contents of which are incorporated herein by reference.

BACKGROUND OF THE INVENTION

1. Field of the Invention

Embodiments of the invention relate to a silicon carbide semiconductor device and a method of manufacturing a silicon carbide semiconductor device.

2. Description of the Related Art

Silicon carbide (SiC) is anticipated to be a next generation semiconductor material of silicon (Si). Compared to conventional semiconductor devices using Si as a material, semiconductor devices using silicon carbide (hereinafter, silicon carbide semiconductor device) have various advantages such as reducing device resistivity in the ON state to several hundredths and use in environments of high temperatures (200 degrees C. or more). Such advantages are enabled by characteristics of the material itself such as the bandgap of SiC being about 3 times that of Si and the dielectric breakdown field strength being nearly 10 times that of Si.

Schottky barrier diodes (SBD) and planar vertical metal oxide semiconductor field effect transistors (MOSFET) have become commercial SiC semiconductor devices.

A trench gate structure is a 3-dimensional structure in which a metal oxide semiconductor (MOS) gate (MOS insulated gate) is embedded in a trench formed in a semiconductor base formed of silicon carbide (hereinafter, silicon carbide base) and a portion along a trench side wall is used as a channel (inversion layer). Therefore, when the device area (chip area) is compared between devices of the same on-resistance (Ron), the device area of the trench gate structure can be made significantly smaller than that of a planar gate structure in which a MOS gate is provided in a flat shape on a silicon carbide base and thus, a trench gate structure may be considered a promising device structure.

A structure of a conventional silicon carbide semiconductor device will be described taking a vertical MOSFET of a trench gate structure as an example. FIG. 24 is a cross-sectional view of a structure of a conventional silicon carbide semiconductor device. The conventional silicon carbide semiconductor device depicted in FIG. 24 includes a MOS gate of a typical trench gate structure on a front surface (surface on a p-type base region 104 side) side of a semiconductor base formed of silicon carbide (hereinafter, silicon carbide base) 100. The silicon carbide base (semiconductor chip) 100 is formed by sequentially forming by epitaxial growth on an $n^+$-type supporting substrate formed of silicon carbide (hereinafter, $n^+$-type silicon carbide substrate) 101, an $n^-$-type drift region 102, an n-type current spreading region 103, and the p-type base region 104 forming silicon carbide layers.

In the n-type current spreading region 103, a first p-type region 111 is selectively provided to cover a bottom of a trench 107 entirely. The first p-type region 111 is provided to a depth reaching the $n^-$-type drift region 102. Further, a second p-type region 112 is selectively provided between adjacent trenches 107 (mesa portion), in the n-type current spreading region 103. The second p-type region 112 contacts the p-type base region 104 and is provided to a depth reaching the $n^-$-type drift region 102. Reference numerals 105, 106, 108, 109, and 113 to 115 are an $n^+$-type source region, a $p^{++}$-type contact region, a gate insulating film, a gate electrode, an interlayer insulating film, a source electrode, and a drain electrode, respectively.

As such a vertical MOSFET of a trench gate structure, a device has been proposed that includes a p-type base layer of a 2-layer structure having p-type semiconductor layers of differing impurity concentrations, sequentially formed by epitaxial growth (for example, refer to Japanese Patent Application Laid-Open Publication No. 2012-099601 (paragraph 0030, FIG. 1) and Japanese Patent Application Laid-Open Publication No. 2015-072999 (paragraph 0060, FIG. 9)). In Japanese Patent Application Laid-Open Publication Nos. 2012-099601 and 2015-072999, among the p-type semiconductor layers forming the p-type base layer, punch-through is suppressed at the p-type semiconductor layer of the higher impurity concentration and the on-resistance is reduced at the p-type semiconductor layer of the lower impurity concentration.

As a method of manufacturing such a vertical MOSFET of a trench structure, a method of ion implanting a p-type impurity to form a p-type base region forming a channel has been proposed (for example, refer to Japanese Patent Application Laid-Open Publication No. 2014-241435 (paragraphs 0020, 0021, 0028, FIGS. 2, 3)). In Japanese Patent Application Laid-Open Publication No. 2014-241435, the p-type base region has an impurity concentration distribution in which the impurity concentration increases as the depth from the substrate front surface increases, the maximum impurity concentration occurs at a predetermined depth, and the impurity concentration decreases as the depth from the substrate front surface increases; and the p-type base region is formed within a depth range where short channel effect occurs.

SUMMARY OF THE INVENTION

A silicon carbide semiconductor device according to one aspect of the present invention includes a first epitaxial layer of a first conductivity type, formed on a front surface of a silicon carbide substrate; a second epitaxial layer of a second conductivity type, formed on an opposite side of the first epitaxial layer from a silicon carbide substrate side thereof; a first semiconductor region of the second conductivity type, selectively formed in the second epitaxial layer, the first semiconductor region having an impurity concentration higher than that of the second epitaxial layer; a second semiconductor region of the first conductivity type, selectively formed in the second epitaxial layer, at a position shallower than the first semiconductor region; a trench that penetrates the second semiconductor region, the first semiconductor region, and the second epitaxial layer, and reaches the first epitaxial layer; a gate electrode provided in the trench, via a gate insulating film; a first electrode that contacts the second semiconductor region and the second epitaxial layer; and a second electrode provided on a rear surface of the silicon carbide substrate. The first semiconductor region has a second-conductivity-type impurity concentration profile in which concentration differences in a depth direction form a bell-shaped curve at a peak of impurity concentration higher than that of the second epitaxial layer.

In the silicon carbide semiconductor device, in the second-conductivity-type impurity concentration profile, the impurity concentration sharply decreases at a border of the second epitaxial layer and the first epitaxial layer.

In the silicon carbide semiconductor device, the peak of impurity concentration in the second-conductivity-type impurity concentration profile is positioned farther on a first electrode side than the border of the second epitaxial layer and the first epitaxial layer.

In the silicon carbide semiconductor device, the first semiconductor region is provided uniformly in a direction parallel to the front surface of the silicon carbide substrate.

The silicon carbide semiconductor device includes a third semiconductor region of the first conductivity type, formed in the first epitaxial layer, the third semiconductor region having an impurity concentration higher than that of the first epitaxial layer. The third semiconductor region contacts the second epitaxial layer and from a border with the second epitaxial layer, reaches a position deeper on a second electrode side than the trench.

The silicon carbide semiconductor device includes a fourth semiconductor region of the second conductivity type, selectively formed in the third semiconductor region, the fourth semiconductor region covering a bottom of the trench.

In the silicon carbide semiconductor device, the fourth semiconductor region penetrates the third semiconductor region from the bottom of the trench.

The silicon carbide semiconductor device includes a fifth semiconductor region of the second conductivity type, formed in the third semiconductor region between the trench and an adjacent trench so as to contact the second epitaxial layer.

In the silicon carbide semiconductor device, the fifth semiconductor region penetrates the third semiconductor region in the depth direction.

A method of manufacturing a silicon carbide semiconductor device according to another aspect of the present invention includes forming a first epitaxial layer of a first conductivity type on a front surface of a silicon carbide substrate; forming a second epitaxial layer of a second conductivity type on the first epitaxial layer; selectively forming a first semiconductor region of the second conductivity type by ion implantation in the second epitaxial layer, the first semiconductor region having an impurity concentration higher than that of the second epitaxial layer; selectively forming a second semiconductor region of the first conductivity type in the second epitaxial layer, at a position shallower than the first semiconductor region; forming a trench to penetrate the second semiconductor region, the first semiconductor region, and the second epitaxial layer, and reach the first epitaxial layer; forming a gate electrode in the trench, via a gate insulating film; forming a first electrode contacting the second semiconductor region and the second epitaxial layer; and forming a second electrode on a rear surface of the silicon carbide substrate. The first semiconductor region is formed to have a second-conductivity-type impurity concentration profile in which concentration differences in a depth direction form a bell-shaped curve at a peak of impurity concentration higher than that of the second epitaxial layer.

In the method of manufacturing a silicon carbide semiconductor device, the ion implantation is performed using an accelerating voltage so that the peak of the impurity concentration in the second-conductivity-type impurity concentration profile is formed at a position deeper than an ion implantation surface.

The method of manufacturing a silicon carbide semiconductor device includes forming a third epitaxial layer of the second conductivity type on the second epitaxial layer after forming the first semiconductor region and before forming the second semiconductor region.

In the method of manufacturing a silicon carbide semiconductor device, the ion implantation is performed using an accelerating voltage so that the peak of the impurity concentration in the second-conductivity-type impurity concentration profile is formed at a position equal to or deeper than an ion implantation surface.

In the method of manufacturing a silicon carbide semiconductor device, the ion implantation is performed using an accelerating voltage so that the peak of the impurity concentration in the second-conductivity-type impurity concentration profile is formed at a depth position farther on a first electrode side than a border of the second epitaxial layer and the first epitaxial layer.

In the silicon carbide semiconductor device, the second-conductivity-type impurity concentration profile has: a first impurity concentration slope where the impurity concentration decreases between the peak and a border of the second epitaxial layer and first epitaxial layer, on a first epitaxial layer side, and a second impurity concentration slope where the impurity concentration decreases from the border of the second epitaxial layer and the first epitaxial layer, on the first epitaxial layer side. The second impurity concentration slope is greater than the first impurity concentration slope.

In the second-conductivity-type impurity concentration profile, the impurity concentration sharply decreases at the border of the second epitaxial layer and the first epitaxial layer, by the second impurity concentration slope.

In the silicon carbide semiconductor device, the impurity concentration of the peak in the second-conductivity-type impurity concentration profile is two times the impurity concentration of the second epitaxial layer or more.

In the silicon carbide semiconductor device, at least a portion of the gate insulating film along a side wall of the trench has a thickness that is 50 nm or more and 100 nm or less.

In the silicon carbide semiconductor device, the impurity concentration of the peak in the second-conductivity-type impurity concentration profile is $3 \times 10^{17}$ atoms/cm$^3$ or more and $5 \times 10^{17}$ atoms/cm$^3$ or less.

In the method of manufacturing a silicon carbide semiconductor device, in forming the first semiconductor region, the impurity concentration of the peak in the second-conductivity-type impurity concentration profile is two times the impurity concentration of the second epitaxial layer or more.

In the method of manufacturing a silicon carbide semiconductor device, in forming the gate electrode, at least a portion of the gate insulating film along a side wall of the trench has a thickness that is 50 nm or more and 100 nm or less.

In the method of manufacturing a silicon carbide semiconductor device, in forming the first semiconductor region, the impurity concentration of the peak in the second-conductivity-type impurity concentration profile is $3 \times 10^{17}$ atoms/cm$^3$ or more and $5 \times 10^{17}$ atoms/cm$^3$ or less.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
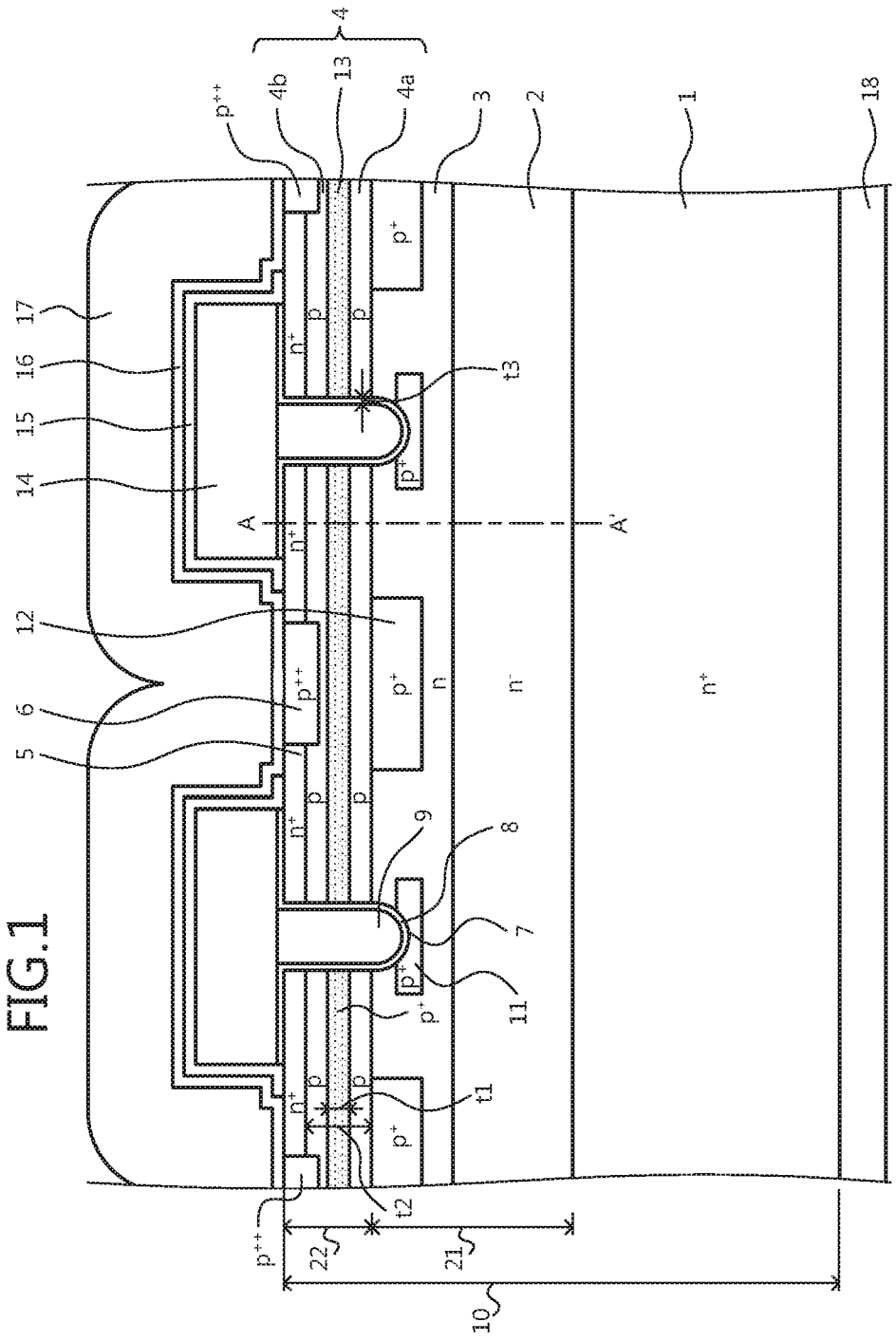
FIG. 1 is a cross-sectional view of a structure of a semiconductor device according to a first embodiment.

Embodiments of a silicon carbide semiconductor device and a method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, identical constituent elements will be given the same reference numerals and will not be repeatedly described.

The semiconductor device according to the present invention is configured using a semiconductor material (hereinafter, wide bandgap semiconductor) having a wider bandgap than silicon. A structure of a semiconductor device (silicon carbide semiconductor device) using silicon carbide (SiC) as the wide bandgap semiconductor will be described as an example. FIG. 1 is a cross-sectional view of a structure of the semiconductor device according to a first embodiment. In FIG. 1, only 2 unit cells (functional units of an element) are depicted, other unit cells adjacent to these are omitted from the drawing (similarly in FIG. 18). The semiconductor device according to the first embodiment depicted in FIG. 1 is a MOSFET having a MOS gate on a front surface (surface on a p-type base region 4 side) side of a semiconductor base (silicon carbide base: semiconductor chip) 10 formed of silicon carbide.

The silicon carbide base 10 is formed by sequentially growing on an $n^+$-type supporting substrate ($n^+$-type silicon carbide substrate) 1 formed of silicon carbide, silicon carbide layers (first and second epitaxial layers) 21, 22 that become an $n^-$-type drift region 2 and the p-type base region 4. Each MOS gate is configured by the p-type base region 4, an $n^+$-type source region (second semiconductor region) 5, a $p^{++}$-type contact region 6, a trench 7, a gate insulating film 8, and a gate electrode 9. In particular, in a surface layer of a source side (a source electrode 16) of the $n^-$-type silicon carbide layer 21, an n-type region (hereinafter, n-type current spreading region (third semiconductor region)) 3 is provided so as to contact the p-type base region 4. The n-type current spreading region 3 is a so-called current spreading layer (CSL) that reduces carrier spreading resistance. The n-type current spreading region 3, for example, is provided uniformly in a direction (hereinafter, horizontal direction) parallel to a base front surface (a front surface of the silicon carbide base 10).

The portion of the $n^-$-type silicon carbide layer 21 exclusive of the n-type current spreading region 3 is the $n^-$-type drift region 2. In the n-type current spreading region 3, first and second $p^+$-type regions (fourth and fifth semiconductor regions) 11, 12 are each selectively provided. The first $p^+$-type region 11 is provided so as to cover a bottom and a bottom corner portion of the trench 7. The bottom corner portion of the trench 7 is the boundary of a side wall and the bottom of the trench 7. The first $p^+$-type region 11 is provided from a position deeper than an interface of the p-type base region 4 and the n-type current spreading region 3, on the drain side to a depth that does not reach an interface of the n-type current spreading region 3 and the $n^-$-type drift region 2. Provision of the first $p^+$-type region 11 enables formation of a pn junction between the first $p^+$-type region 11 and the n-type current spreading region 3, near the bottom of the trench 7.

The second $p^+$-type region 12 is provided between adjacent trenches 7 (mesa portion), away from the first $p^+$-type region 11 and contacts the p-type base region 4. Portions of the second $p^+$-type region 12 may extend on the trench 7 sides and partially contact the first $p^+$-type regions 11. Further, the second $p^+$-type region 12 is provided from the interface of the p-type base region 4 and the n-type current spreading region 3 to a depth that does not reach the interface of the n-type current spreading region 3 and the $n^-$-type drift region 2. Provision of the second $p^+$-type region 12 enables formation of a pn junction between the second $p^+$-type region 12 and the n-type current spreading region 3, between the adjacent trenches 7, at a position deeper than the bottom of the trenches 7. Formation of the pn junctions by the first and second $p^+$-type regions 11, 12 and the n-type current spreading region 3 in this manner enables application of high electric field to a trench 7 bottom portion of the gate insulating film 8 to be prevented.

In the p-type silicon carbide layer 22, the $n^+$-type source region 5 and the $p^{++}$-type contact region 6 are each selectively provided to contact each other. The depth of the $p^{++}$-type contact region 6, for example, may be deeper than the $n^+$-type source region 5. The portion of the p-type silicon carbide layer 22 exclusive of the $n^+$-type source region 5 and the $p^{++}$-type contact region 6 is the p-type base region 4. In the p-type base region 4, a $p^+$-type region (hereinafter, high-concentration implantation region (first semiconductor region)) 13 is formed by ion implantation of a p-type impurity (hatched portion).

The high-concentration implantation region 13, for example, is provided uniformly in the horizontal direction so as to include portions of the p-type base region 4 where a channel is formed. The portions of the p-type base region 4 where the channel is formed are the portions of the p-type base region 4 along the side walls of the trench 7. Reference characters 4a and 4b are, respectively, a portion (hereinafter, the first p-type base portion) farther on the drain side than the high-concentration implantation region 13 and a portion (hereinafter, the second p-type base portion) farther on the source side than the high-concentration implantation region 13, in the p-type base region 4. The first and the second p-type base portions 4a, 4b have an impurity concentration that is lower than that of the high-concentration implantation region 13.

Figure 2:
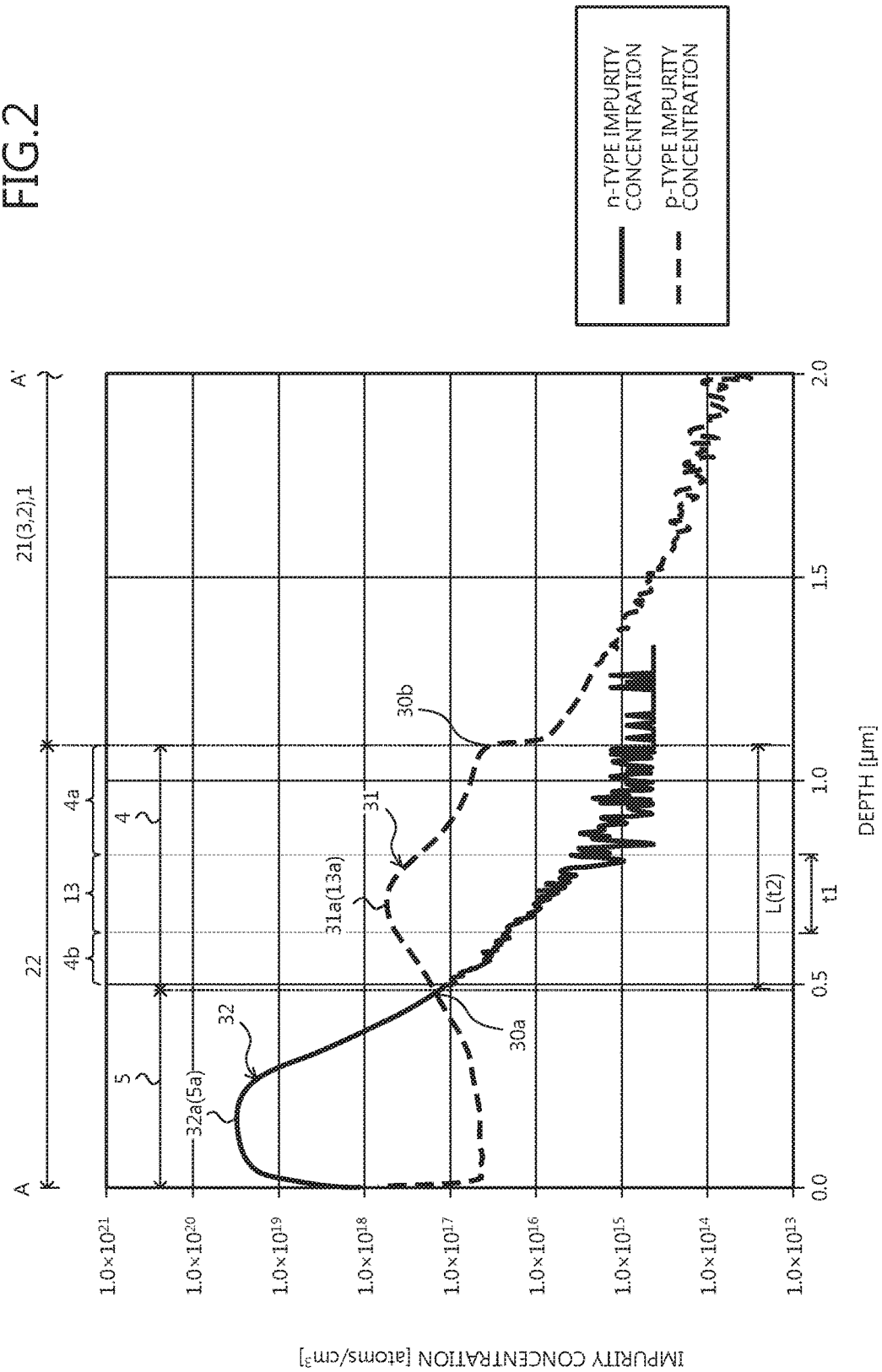
FIG. 2 is a characteristic diagram depicting an impurity concentration profile at cutting line A-A' in FIG. 1.

The first and the second p-type base portions 4a, 4b and the high-concentration implantation region 13 make up the p-type base region 4. In the portions of the first and the second p-type base portions 4a, 4b and of the high-concentration implantation region 13, along the side walls of the trenches 7, an n-type inversion layer (channel) is formed during the ON state. In FIGS. 1 and 2, although the high-concentration implantation region 13 is depicted having a predetermined thickness t1 to clarify the arrangement of the high-concentration implantation region 13, the high-concentration implantation region 13 is a portion formed by ion implantation of a p-type impurity and has a Gaussian distribution p-type impurity concentration profile (impurity concentration distribution) 31 (refer to FIG. 2).

In particular, the high-concentration implantation region 13 has a p-type impurity concentration profile 31 in which concentration differences in the depth direction form a bell-shaped curve at a peak 13a of impurity concentration higher than that of the p-type silicon carbide layer 22 forming the p-type base region 4. In other words, the peak 13a of the p-type impurity concentration profile 31 is in the p-type base region 4, and the impurity concentration decreases from the position of the peak 13a, on both principal surface sides (source side and drain side) of the base by respective predetermined slopes. The depth of the position of the peak 13a of the high-concentration implantation region 13 is within a range from a position deeper than or equal to the depth of the position of the interface of the $n^+$-type source region 5 and the p-type base region 4 and a position shallower than the depth of the position of the interface of the p-type base region 4 and the n-type current spreading region 3.

Preferably, the depth of the position of the peak 13a of the high-concentration implantation region 13 may be within a range from the interface of the $n^+$-type source region 5 and the p-type base region 4 to a depth that is about 80% of a thickness t2 of the p-type base region 4 (=0.8×t2), and the peak 13a may be positioned within a range from the interface of the $n^+$-type source region 5 and the p-type base region 4 to a depth that is about 10% to 70% of the thickness t2 of the p-type base region 4. The reason for this is that the tradeoff relation of reduced on-resistance and reduced variation of gate threshold voltage Vth is further improved. The thickness t2 of the p-type base region 4 is a thickness from the interface of the $n^+$-type source region 5 and the p-type base region 4 to the interface of the p-type base region 4 and the n-type current spreading region 3.

In other words, the peak 13a of the high-concentration implantation region 13 is at a position that is shallower than the n-type current spreading region 3 with respect to the base front surface and that is away from the n-type current spreading region 3 in depth. When the depth of the position of the peak 13a of the high-concentration implantation region 13 is the depth of the position of the interface of the $n^+$-type source region 5 and the p-type base region 4, the high-concentration implantation region 13 contacts the $n^+$-type source region 5 and the $p^{++}$-type contact region 6 whereby, the second p-type base portion 4b is not formed. The p-type impurity concentration profile resulting from ion implantation of a p-type impurity for forming the high-concentration implantation region 13 will be described in detail hereinafter.

Figure 24:
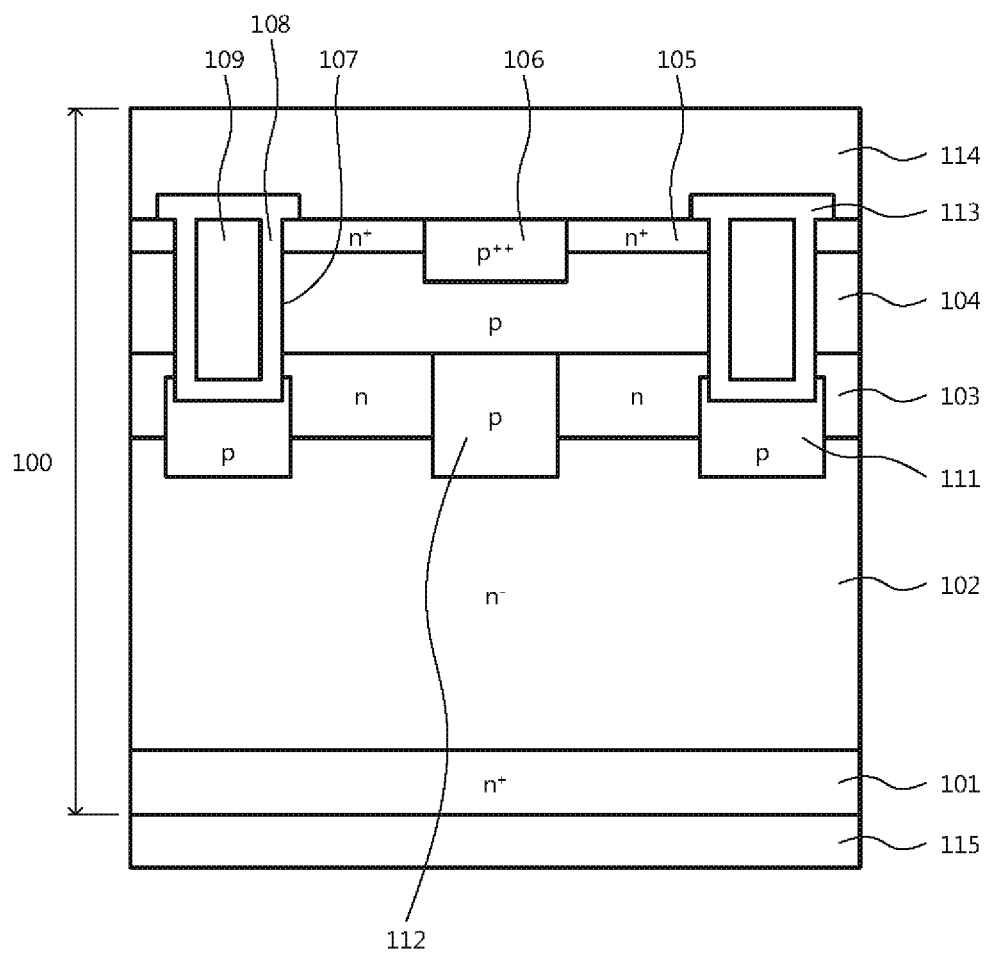
FIG. 24 is a cross-sectional view of a structure of a conventional silicon carbide semiconductor device.

The high-concentration implantation region 13 may have multiple impurity concentration peaks 13a at differing depths. In this case, the depths of the positions of all of the impurity concentration peaks 13a of the high-concentration implantation region 13 are within the ranges described above. Disorder in the crystal structure (for example, defects such as dislocations) occurs partially in the p-type base region 4 to a greater extent with the ion implantation for forming the high-concentration implantation region 13 than in a case of only epitaxial growth. Therefore, when the p-type base region 4 is formed by only epitaxial growth without ion implantation of an impurity (i.e., the conventional structure depicted in FIG. 24), the film quality partially differs.

The trench 7 penetrates the $n^+$-type source region 5, the high-concentration implantation region 13, and the p-type base region 4 from the base front surface and reaches the n-type current spreading region 3. In the trench 7, the gate insulating film 8 is provided along the side walls of the trench 7 and the gate electrode 9 is provided on the gate insulating film 8. A source-side end of the gate electrode 9 may or may not protrude outwardly from the base front surface. The gate electrode 9 is electrically connected to a gate pad (not depicted) at a portion not depicted. An interlayer insulating film 14 is provided on the entire base front surface so as to cover the gate electrode 9 embedded in the trench 7.

The source electrode (first electrode) 16 contacts the $n^+$-type source region 5 and the $p^{++}$-type contact region 6 via a contact hole in the interlayer insulating film 14 and is electrically insulated from the gate electrode 9 by the interlayer insulating film 14. Between the source electrode 16 and the interlayer insulating film 14, for example, a barrier metal 15 may be provided that prevents diffusion of metal atoms from the source electrode 16 to the gate electrode 9 side. On the source electrode 16, a source pad 17 is provided. On a rear surface of the silicon carbide base 10 (rear surface of the $n^+$-type silicon carbide substrate 1 forming the $n^+$-type drain region), a drain electrode (second electrode) 18 is provided.

The p-type impurity concentration profile resulting from the ion implantation of a p-type impurity for forming the high-concentration implantation region 13 will be described. FIG. 2 is a characteristic diagram depicting the impurity concentration profile at cutting line A-A' in FIG. 1. In FIG. 2, a horizontal axis is the depth from the base front surface (the interface of the source electrode 16 and the silicon carbide base 10) and a vertical axis is the impurity concentration. In addition to the p-type impurity concentration profile 31 resulting from the ion implantation of a p-type impurity for forming the high-concentration implantation region 13, FIG. 2 depicts an n-type impurity concentration profile 32 resulting from ion implantation of an n-type impurity for forming the $n^+$-type source region 5. In FIG. 2, the n-type impurity (n-type-dopant) is assumed to be phosphorus (P) and the p-type impurity (p-type-dopant) is assumed to be aluminum (Al).

As depicted in FIG. 2, the impurity concentration (background impurity concentration) of the p-type silicon carbide layer 22 forming the p-type base region 4 epitaxially grown on the n⁻-type silicon carbide layer 21 is about $4 \times 10^{16}$ atoms/cm³. Consequent to the ion implantation of an n-type impurity for forming the n⁺-type source region 5, in the p-type silicon carbide layer 22, the n-type impurity concentration profile 32 having a peak 32a impurity concentration higher than that of the p-type silicon carbide layer 22 at a relatively shallow position is formed. In the n-type impurity concentration profile 32, the impurity concentration decreases from the position of the peak 32a on the drain side, by a predetermined slope. A portion from the base front surface (the opposite side of the p-type silicon carbide layer 22 from the n⁻-type silicon carbide layer 21 side) to an intersection 30a of the n-type impurity concentration profile 32 and the p-type impurity concentration profile 31 is the n⁺-type source region 5. The peak 32a of the n-type impurity concentration profile 32 is a peak 5a of the impurity concentration profile of the n⁺-type source region 5.

Further, consequent to the ion implantation of a p-type impurity for forming the high-concentration implantation region 13, in the p-type silicon carbide layer 22, the p-type impurity concentration profile 31 having a peak 31a impurity concentration at a position deeper than the peak 32a of the n-type impurity concentration profile 32 from the base front surface is formed. The peak 31a of the p-type impurity concentration profile 31 is the peak 31a of the impurity concentration profile of the high-concentration implantation region 13. Further, in the p-type impurity concentration profile 31, the impurity concentration decreases on the source side and the drain side by respective predetermined slopes, from the position of the peak 31a in a bell-shaped curve. Additionally, in the p-type impurity concentration profile 31, the impurity concentration sharply decreases at an interface 30b of the p-type silicon carbide layer 22 and the n⁻-type silicon carbide layer 21, and the impurity concentration decreases by a predetermined slope from the interface 30b toward to drain side. In the present specification and claims, the term "sharply decreases" refers to a change in impurity concentration of between four times and ten times over a distance in depth of between 0.01 µm and 0.25 µm. According to one embodiment, as shown in FIG. 2, the change in impurity concentration is approximately six times at the boundary of the p-type silicon carbide layer 22 and the n⁻-type silicon carbide layer 21. Or in other words, an impurity concentration in the n-type silicon carbide layer 21 at the boundary of the n-type silicon carbide layer 21 and the p-type silicon carbide layer 22 is approximately six times less than the impurity concentration of the p-type silicon carbide layer 22 at the boundary of the n-type silicon carbide layer 21 and the p-type silicon carbide layer 22.

The higher the impurity concentration of the peak 31a in the p-type impurity concentration profile 31 is, the higher the effect of reducing variation of the gate threshold voltage Vth is. For example, the impurity concentration of the peak 31a in the p-type impurity concentration profile 31 is favorably about 2 times the impurity concentration of the p-type silicon carbide layer 22 or more, and is desirably about 10 times or more. On the other hand, the higher the impurity concentration of the peak 31a in the p-type impurity concentration profile 31 is, the higher the gate threshold voltage Vth is compared to a conventional structure (for example, refer to FIG. 24) not having the p-type impurity concentration profile 31. Therefore, the thickness of the gate insulating film 8 may be reduced to reduce the gate threshold voltage Vth to achieve the same predetermined gate threshold voltage Vth as a conventional structure verified for various types of conformity with other elements, circuits, etc. The thickness of gate insulating film 8 may be reduced across the entire surface of the inner wall of the trench 7, or may be reduced at a portion along the side wall of the trench 7.

For example, a thickness t3 of a portion of the gate insulating film 8 at the side wall of the trench 7 is set to be in a range of about 50 nm or more to 100 nm or less, and the impurity concentration of the peak 31a of the p-type impurity concentration profile 31 is set to be in a range of about $3 \times 10^{17}$ atoms/cm³ or more and $5 \times 10^{17}$ atoms/cm³ or less. Within these ranges, adjustment of the thickness of the gate insulating film 8 and the impurity concentration of the peak 31a of the p-type impurity concentration profile 31 enables an effect to be obtained in that the above predetermined gate threshold voltage Vth is set and variation of the gate threshold voltage Vth is reduced. In particular, when the thickness t3 of the portion of the gate insulating film 8 at the side wall of the trench 7 is, for example, 80 nm, the impurity concentration of the peak 31a of the p-type impurity concentration profile 31 is, for example, $6 \times 10^{17}$ atoms/cm³. When the thickness t3 of the portion of the gate insulating film 8 at the side wall of the trench 7 is, for example, 60 nm, the impurity concentration of the peak 31a of the p-type impurity concentration profile 31 is, for example, $6.9 \times 10^{17}$ atoms/cm³.

The p-type impurity concentration profile 31 such as this is obtained by performing the ion implantation of a p-type impurity for forming the high-concentration implantation region 13 after the p-type silicon carbide layer 22 forming the p-type base region 4 is formed by epitaxial growth. When the p-type base region 104 is formed by only epitaxial growth such as in the conventional structure (refer to FIG. 24), impurity concentration control is difficult and the p-type impurity concentration profile 31 is not obtained. A portion from the intersection 30a of the n-type impurity concentration profile 32 and the p-type impurity concentration profile 31 to the interface 30b of the p-type silicon carbide layer 22 and the n⁻-type silicon carbide layer 21 is the p-type base region 4. A portion deeper on the drain side than the interface 30b of the p-type silicon carbide layer 22 and the n⁻-type silicon carbide layer 21 is the n⁻-type silicon carbide layer 21 forming the n-type current spreading region 3 and the n⁻-type drift region 2.

The impurity concentration of the p-type silicon carbide layer 22 forming the p-type base region 4, for example, may be preferably within a range of $1 \times 10^{16}$ atoms/cm³ or more to $2 \times 10^{17}$ atoms/cm³ or less, as within this range, effects identical to those of the above example are obtained. Further, the impurity concentration of the peak 31a of the p-type impurity concentration profile 31 may be preferably within a range of $2 \times 10^{16}$ atoms/cm³ or more to $5 \times 10^{18}$ atoms/cm³ or less. When the peak 31a of the impurity concentration of the p-type impurity concentration profile 31 is set to be higher than the impurity concentration of the p-type silicon carbide layer 22, effects identical to those of the above example are obtained. Although a channel length L is assumed to be 0.6 µm, configuration is not limited hereto and the channel length L may be preferably 0.3 µm or more and 1 µm or less. The channel length L is a length from the intersection 30a of the n-type impurity concentration profile 32 and the p-type impurity concentration profile 31 to the interface 30b of the p-type silicon carbide layer 22 and the n⁻-type silicon carbide layer 21.

Figure 3:
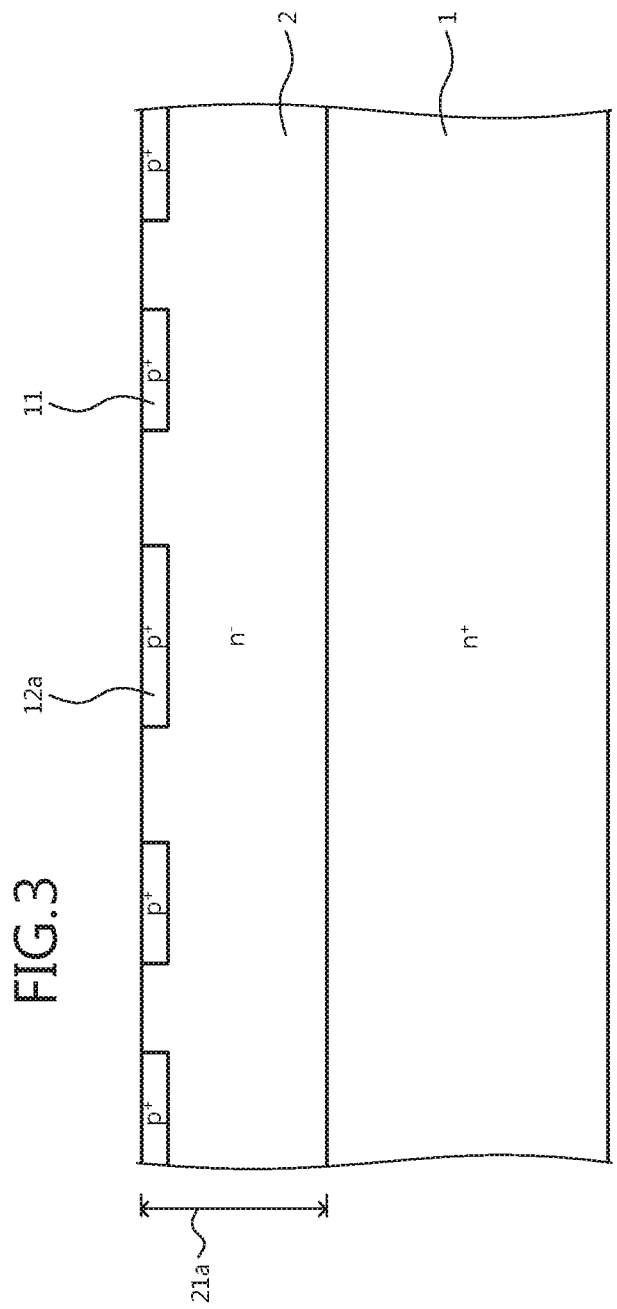
FIGS. 3, 4, 5, 6, 7, 8, 9, 10, 11, 12, 13, and 14 are cross-sectional views of the semiconductor device according to the first embodiment during manufacture.

The method of manufacturing a silicon carbide semiconductor device according to the first embodiment will be described. FIGS. 3, 4, 5, 6, 7, 8, 9, 10, 11, 12, 13, and 14 are cross-sectional views of the semiconductor device according to the first embodiment during manufacture. As depicted in FIG. 3, the n$^+$-type silicon carbide substrate 1 forming the n$^+$-type drain region is prepared. Subsequently, on the front surface of the n$^+$-type silicon carbide substrate 1, the n$^-$-type silicon carbide layer 21a forming the n-type silicon carbide layer 21 is formed by epitaxial growth. Subsequently, the first p$^+$-type regions 11 and p$^+$-type regions (hereinafter, p$^+$-type partial regions) 12a are each selectively formed in the surface layer of the n$^-$-type silicon carbide layer 21a by photolithography and the ion implantation of a p-type impurity. The p$^+$-type partial regions 12a are a portion of the second p$^+$-type region 12.

Figure 4:
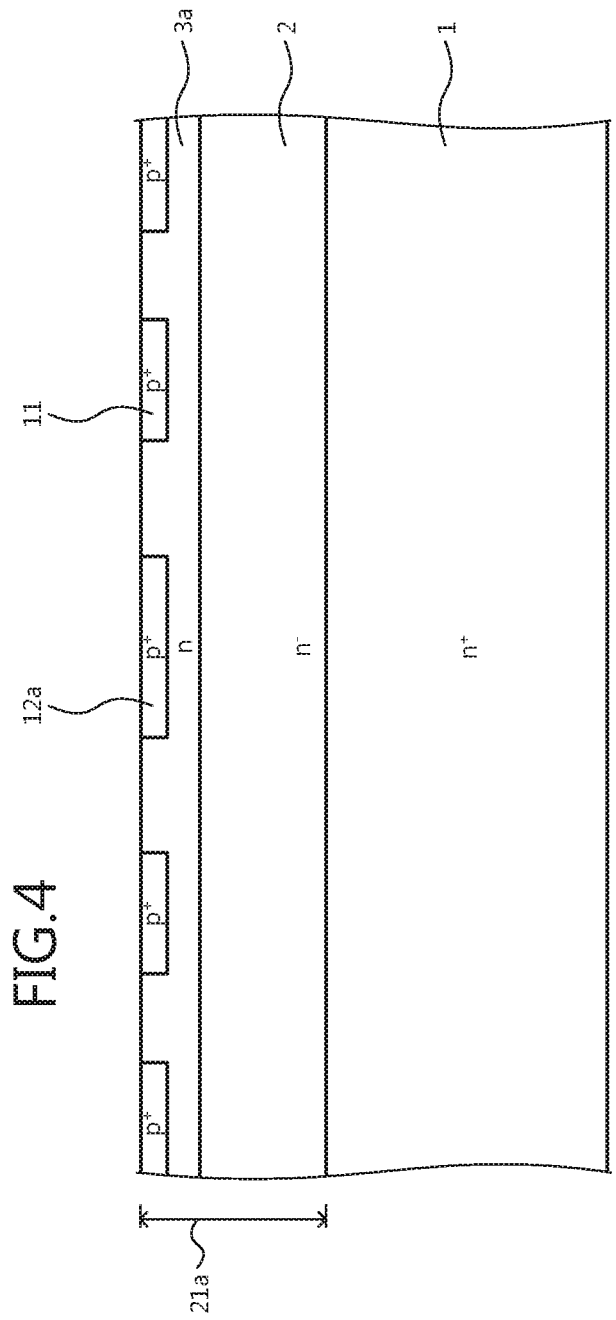

Subsequently, as depicted in FIG. 4, an n-type impurity is ion implanted in the entire n$^-$-type silicon carbide layer 21a, forming an n-type region (hereinafter, n-type partial region) 3a in the entire surface layer of the n$^-$-type silicon carbide layer 21a. The n-type partial region 3a is a portion of the n-type current spreading region 3. At this time, the depth of the n-type partial region 3a is made deeper than the first p$^+$-type regions 11 and the entire drain side (the n$^+$-type silicon carbide substrate 1 side) of the first p$^+$-type regions 11 and the p$^+$-type partial regions 12a are covered by the n-type partial region 3a. A portion of the n$^-$-type silicon carbide layer 21a farther on the drain side than the n-type partial region 3a forms the n$^-$-type drift region 2. The sequence in which the n-type partial region 3a and, the first p$^+$-type regions 11 and the p$^+$-type partial regions 12a are formed may be interchanged. The ion implantation may be at an ambient temperature (less than 200 degrees C.) or may be at a high temperature (200 degrees C. to 500 degrees C.). In the case of ion implantation at an ambient temperature, a resist film is used as a mask, and in the case of ion implantation at a high temperature, an oxide film is used as a mask (the same is assumed for all ion implantations discussed hereinafter).

Figure 5:
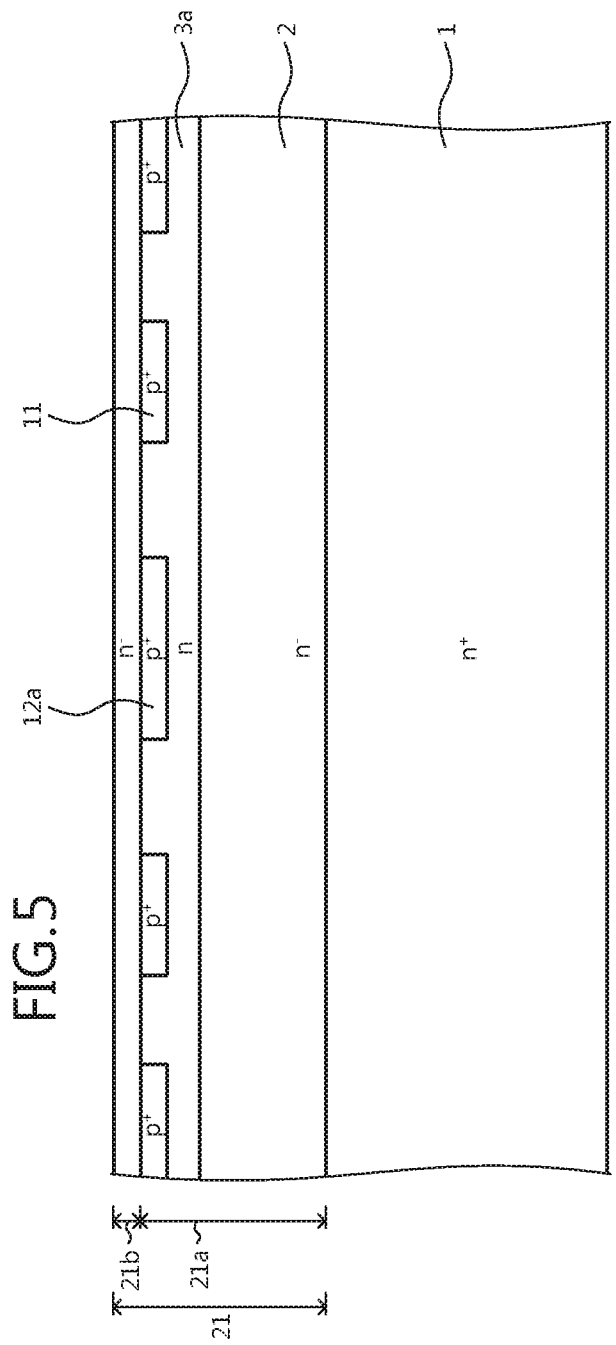
Figure 6:
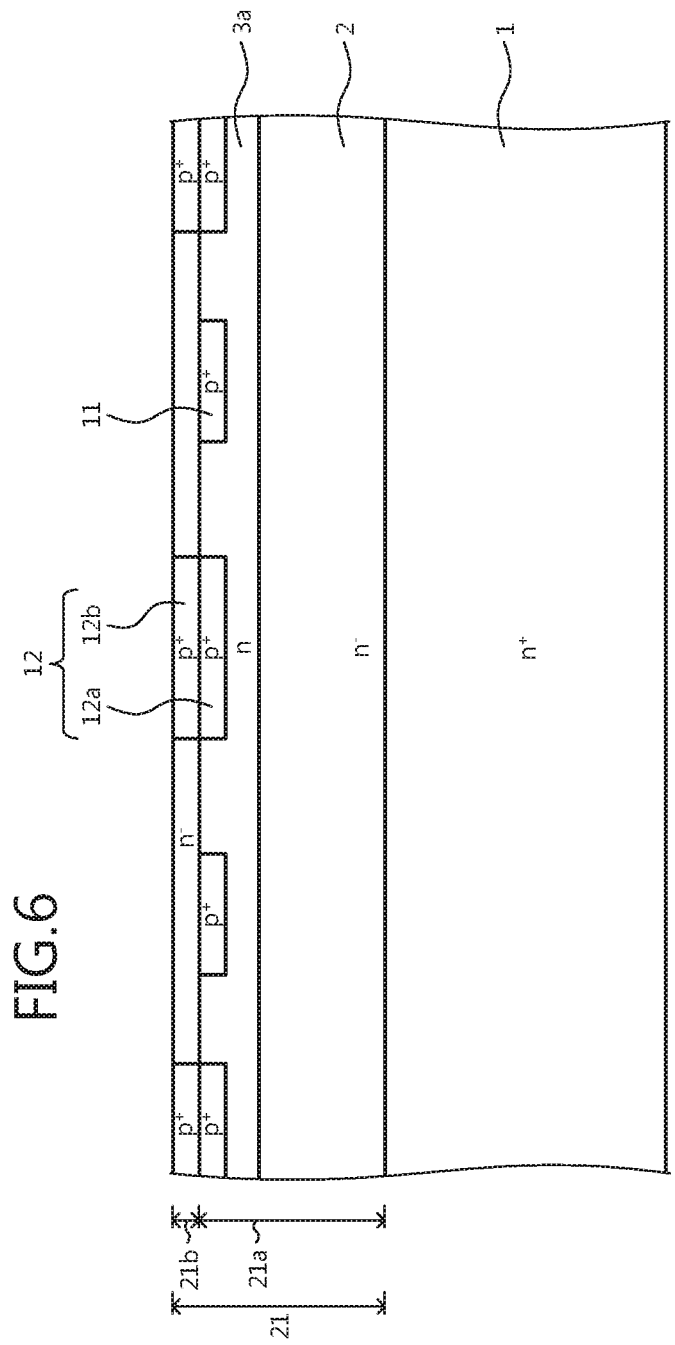

As depicted in FIG. 5, next, on the n$^-$-type silicon carbide layer 21a, an n$^-$-type silicon carbide layer 21b forming the n$^-$-type silicon carbide layer 21 described above is formed by epitaxial growth. Next, as depicted in FIG. 6, by photolithography and ion implantation of a p-type impurity, p$^+$-type partial regions 12b are selectively formed in a portion of the n$^-$-type silicon carbide layer 21b facing the p$^+$-type partial regions 12a, to a depth reaching the p$^+$-type partial regions 12a. The width and impurity concentration of the p$^+$-type partial regions 12b are, for example, substantially the same as those of the p$^+$-type partial region 12a. The p$^+$-type partial regions 12a, 12b are joined in the depth direction (vertical direction) whereby, the second p$^+$-type region 12 is formed.

Figure 7:
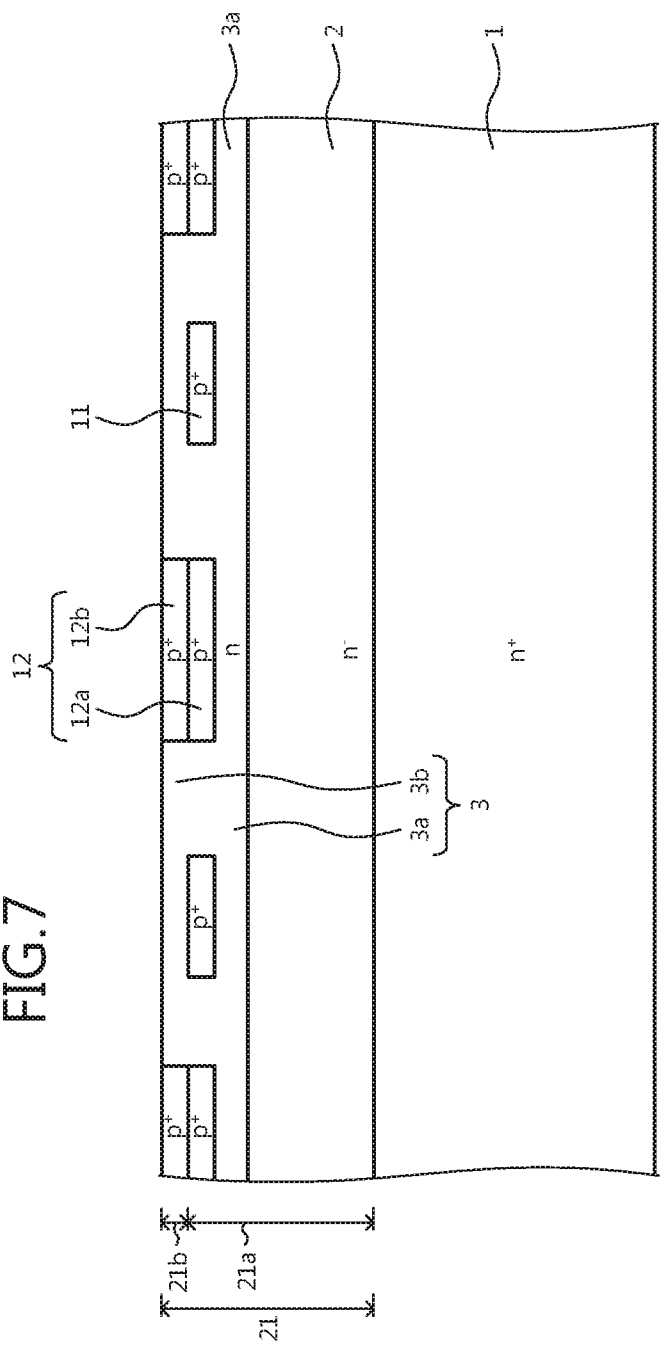
Figure 8:
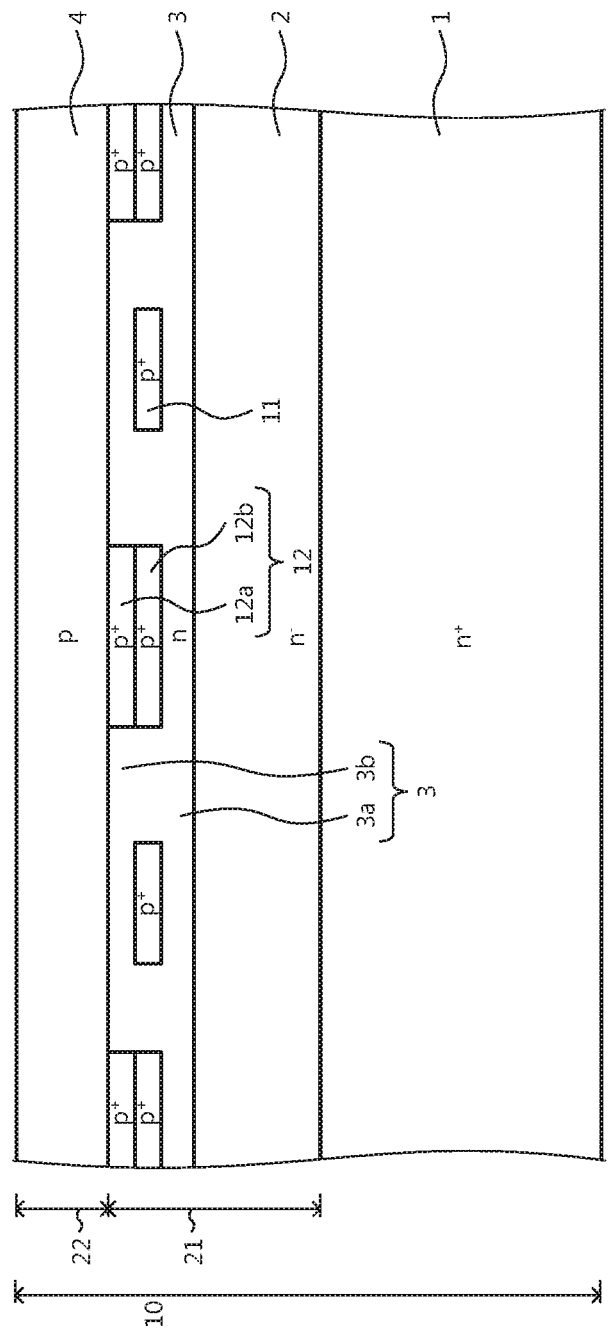

Next, as depicted in FIG. 7, an n-type impurity is ion implanted in the entire n$^-$-type silicon carbide layer 21b, forming an n-type partial region 3b in the entire n$^-$-type silicon carbide layer 21b, to a depth reaching the n-type partial region 3a. The impurity concentration of the n-type partial region 3b may be substantially the same as that of the n-type partial region 3a. The n-type partial regions 3a, 3b are joined in the depth direction whereby, the n-type current spreading region 3 is formed. The sequence in which the p$^+$-type partial regions 12b and the n-type partial region 3b are formed may be interchanged. Next, as depicted in FIG. 8, the p-type silicon carbide layer 22 is formed by epitaxial growth on the n$^-$-type silicon carbide layer 21. By the process steps thus far, on the n$^+$-type silicon carbide substrate 1, the n$^-$-type silicon carbide layer 21 and the p-type silicon carbide layer 22 are sequentially deposited, forming the silicon carbide base (semiconductor wafer) 10.

Figure 9:
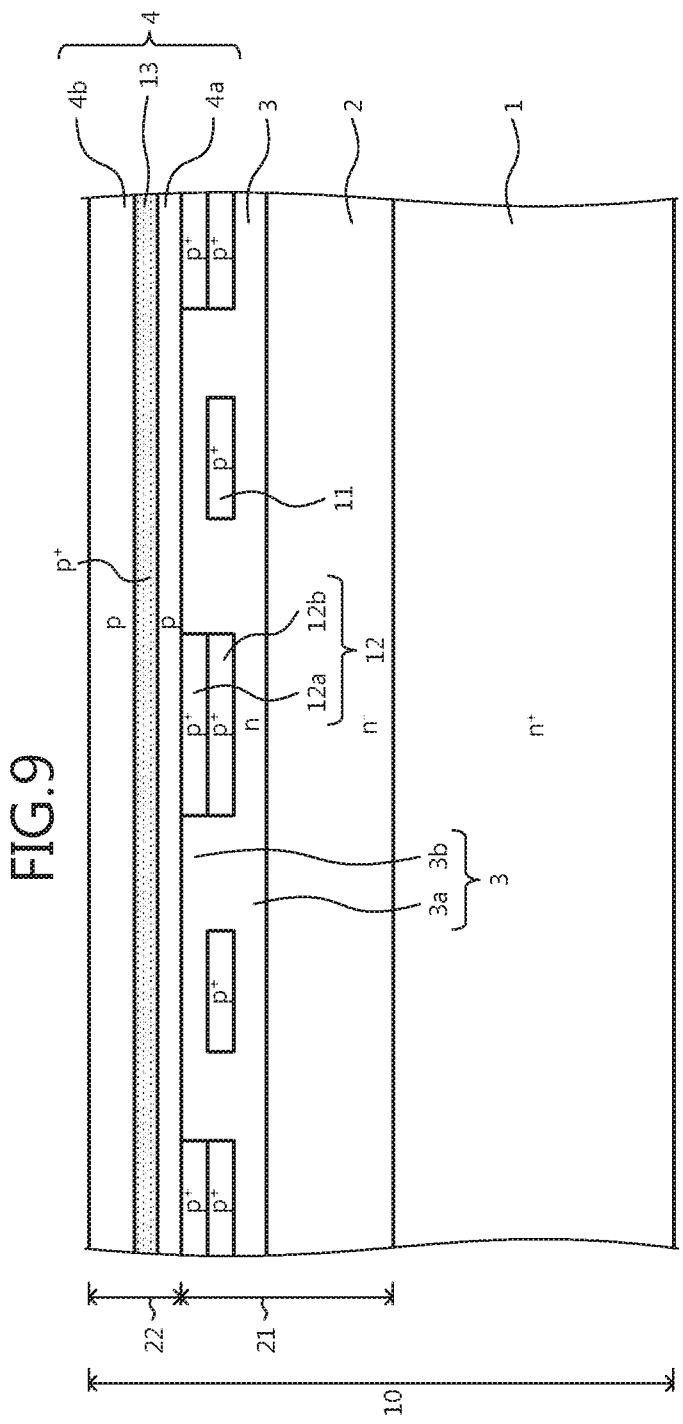

Next, as depicted in FIG. 9, a p-type impurity is ion implanted in the p-type silicon carbide layer 22 entirely so as to form the high-concentration implantation region 13 to have the predetermined thickness t1, at a predetermined depth in the p-type silicon carbide layer 22. As a result, for example, in the p-type silicon carbide layer 22, a portion farther on the drain side than the high-concentration implantation region 13 forms the first p-type base portion 4a, and a portion farther on the source side (the opposite side with respect to the n$^+$-type silicon carbide substrate 1 side) than the high-concentration implantation region 13 forms the second p-type base portion 4b. The p-type base region 4 is formed by the first and the second p-type base portions 4a, 4b and the high-concentration implantation region 13.

Figure 10:
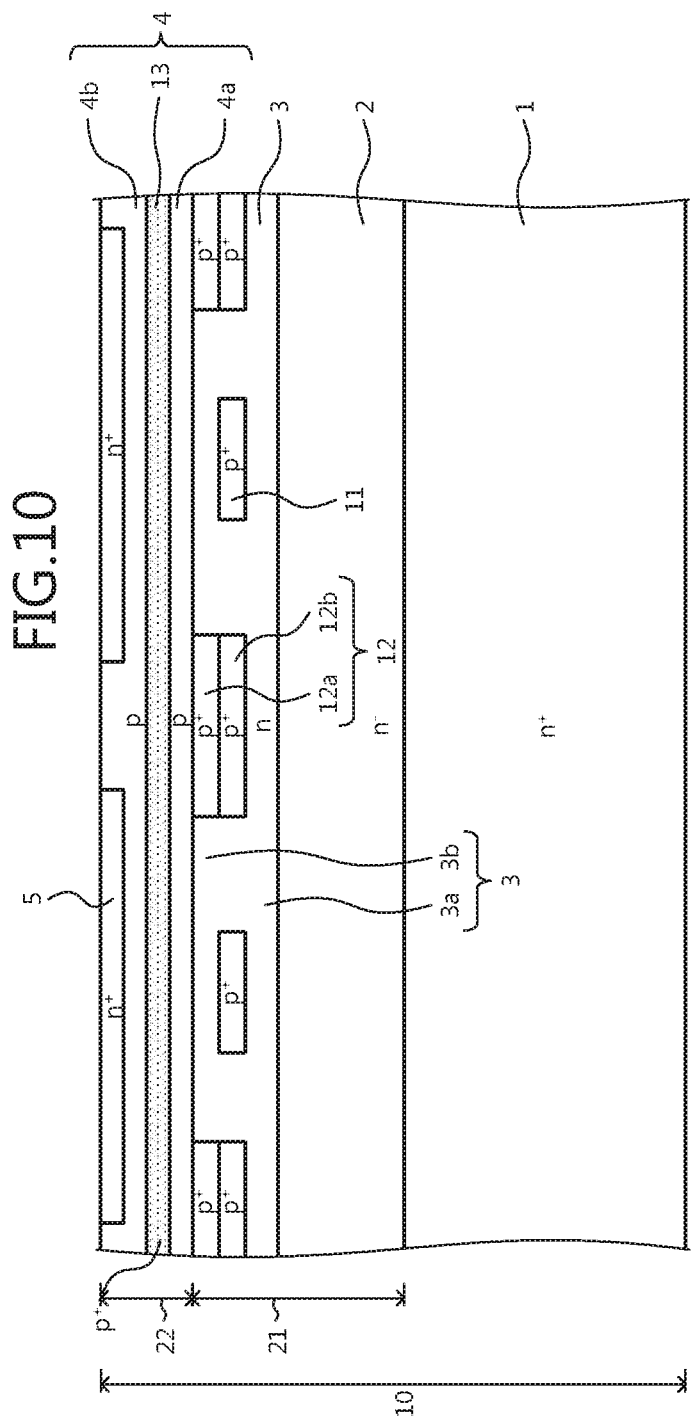
Figure 11:
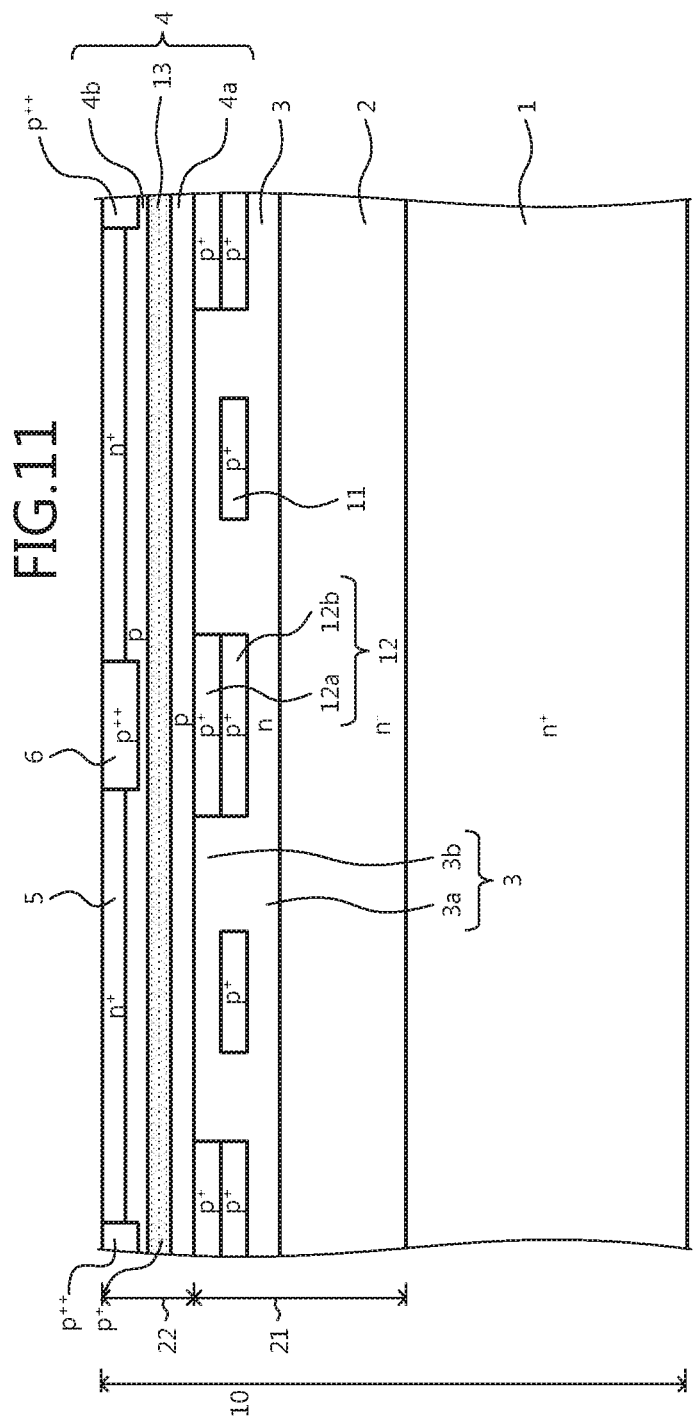

Next, as depicted in FIG. 10, by photolithography and ion implantation of an n-type impurity, the n$^+$-type source region 5 is selectively formed in the surface layer of the p-type silicon carbide layer 22. The n$^+$-type source region 5 may contact the high-concentration implantation region 13. Next, as depicted in FIG. 11, by photolithography and ion implantation of a p-type impurity, each p$^{++}$-type contact region 6 is selectively formed in the surface layer of the p-type silicon carbide layer 22 so as to contact the n$^+$-type source regions 5. In other words, the n$^+$-type source regions 5 and the p$^{++}$-type contact regions 6 are each selectively formed in the second p-type base portion 4b. The sequence in which the n$^+$-type source region 5 and the p$^{++}$-type contact region 6 are formed may be interchanged.

After all ion implantations have been completed, activation annealing is performed. The activation annealing temperature, for example, may be preferably from 1500 degrees C. to 1900 degrees C. At the time of the activation annealing, for example, formation of a carbon (C) film on the surface by sputtering, etc. and annealing is desirable.

Figure 12:
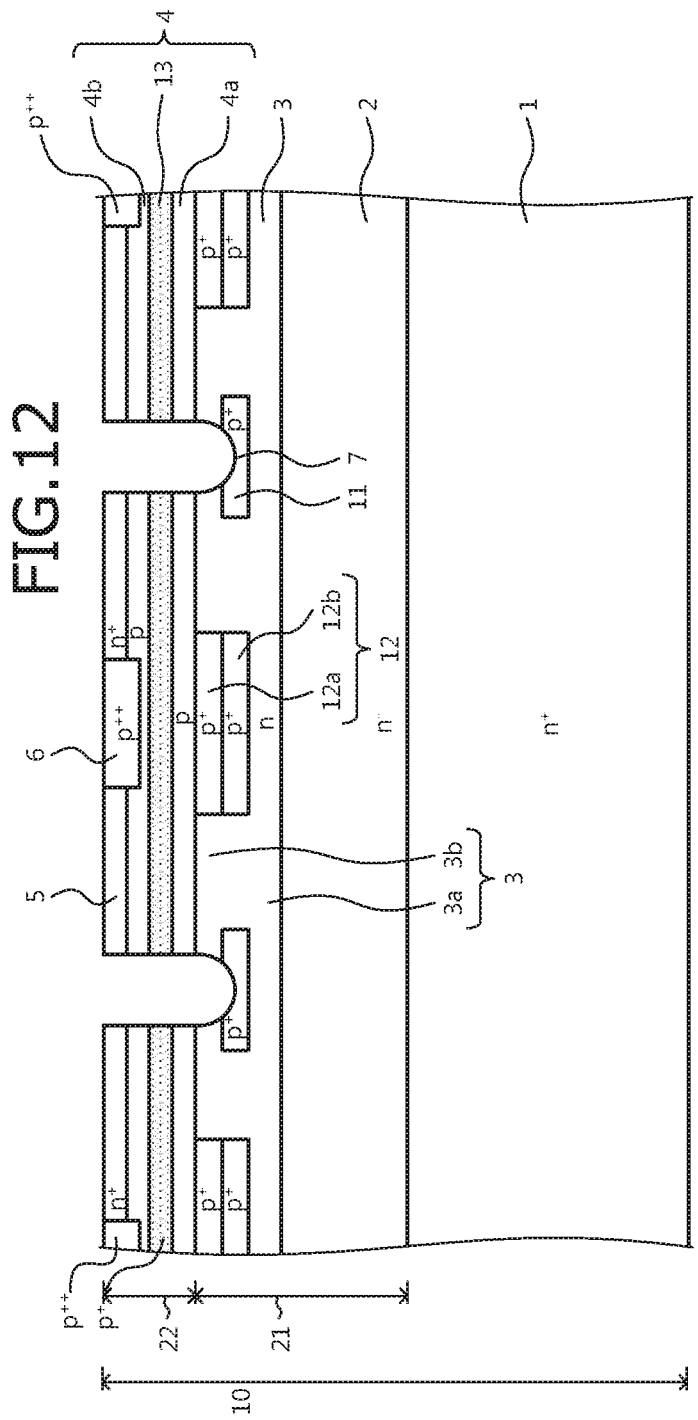
Figure 13:
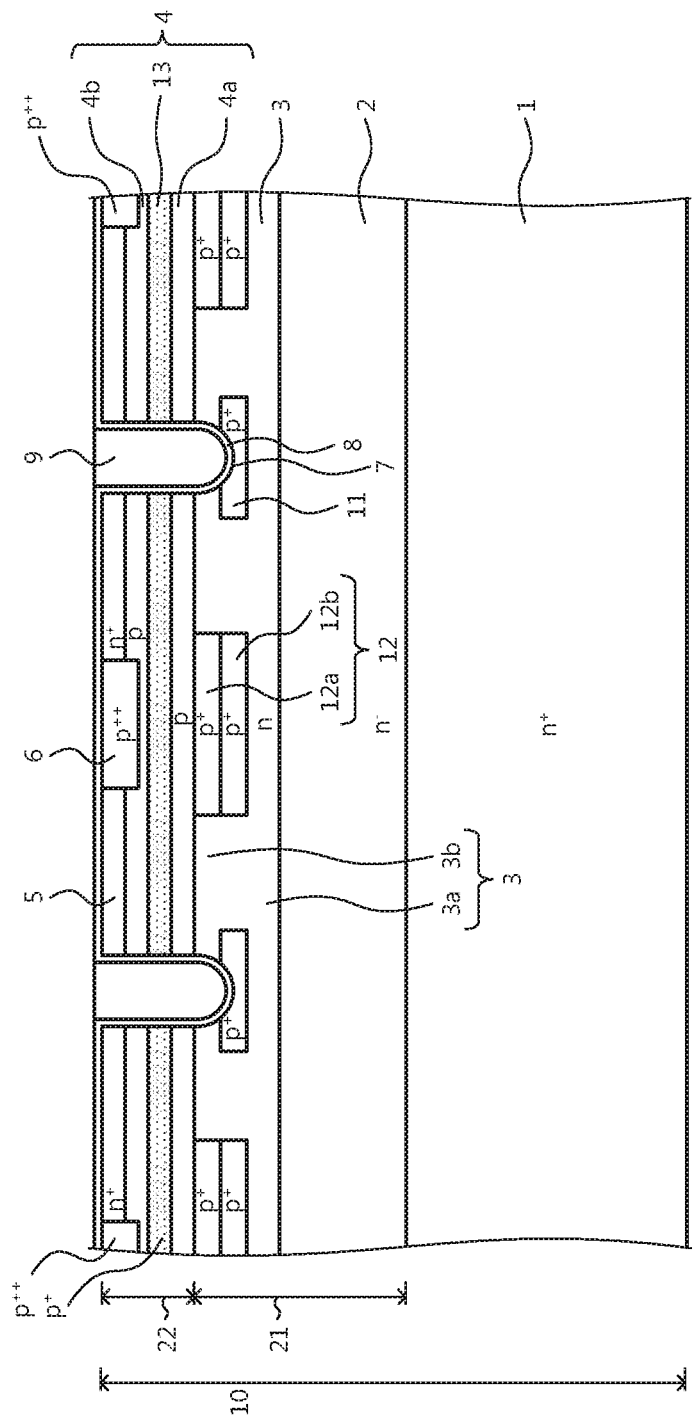

Next, as depicted in FIG. 12, by photolithography and etching, each trench 7 is formed to penetrate the n$^+$-type source region 5, the first and the second p-type base portions 4a, 4b, and the high-concentration implantation region 13, to reach the corresponding first p$^+$-type region 11 in the n-type current spreading region 3. As a mask at the time of trench formation, an oxide film is used. Further, after trench etching, isotropic etching to remove damage of the trenches 7, hydrogen annealing to round corners of an open portion of the trenches 7 and the bottom of the trenches, etc. may be performed. Only one of the isotropic etching and the hydrogen annealing may be performed. Alternatively, after the isotropic etching is performed, the hydrogen annealing may be performed. Next, as depicted in FIG. 13, the gate insulating film 8 is formed along the front surface (the surface of the p-type silicon carbide layer 22) of the silicon carbide base 10 and an inner wall of each of the trenches 7. Next, for example, poly-silicon (poly-Si) may be deposited and etched so as to be embedded in the trenches 7 whereby, the poly-silicon remains in the trenches 7 to form the gate electrode 9. In this case, etching and etching to leave the poly-silicon on an inner side from a base surface portion may be performed; patterning and etching may be performed so that the poly-silicon protrudes from the base surface portion.

Figure 14:
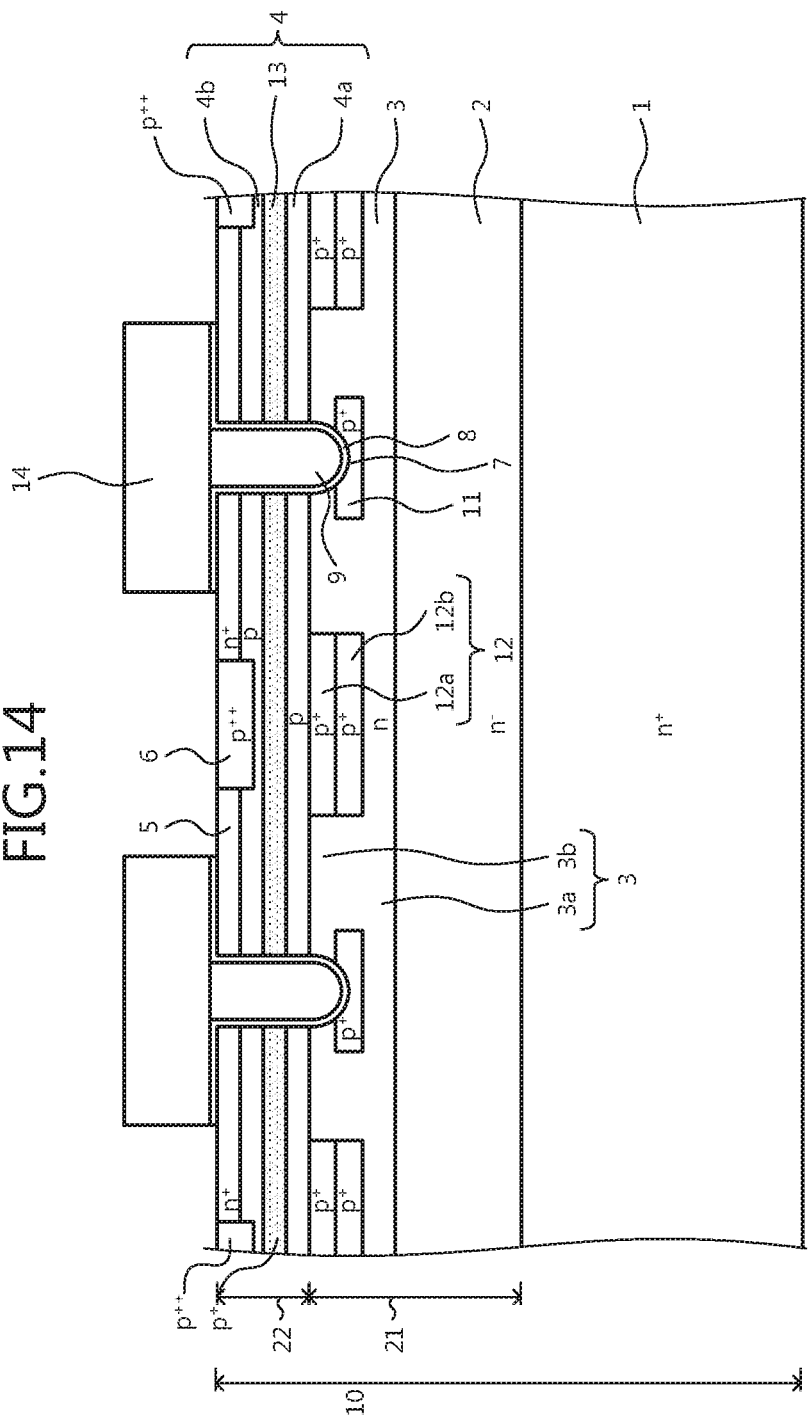

Next, as depicted in FIG. 14, the interlayer insulating film 14 is formed on the entire front surface of the silicon carbide base 10 so as to cover the gate electrode 9. The interlayer insulating film 14, for example, is formed by a non-doped silicate glass (NSG), a phosphosilicate glass (PSG), a boro phospho silicate glass (BPSG), a high temperature oxide (HTO), or a combination thereof. Next, the interlayer insulating film 14 and the gate insulating film 8 are patterned and contact holes are formed, exposing the n$^+$-type source region 5 and the p$^{++}$-type contact region 6. Next, the barrier metal 15 is formed and patterned so as to cover the interlayer insulating film 14, and the n$^+$-type source region 5 and the p$^{++}$-type contact region 6 are again exposed. Next, the source electrode 16 is formed so as to contact the n$^+$-type source region 5 and the p$^{++}$-type contact region 6. The source electrode 16 may be formed so as to cover the barrier metal 15; the source electrode 16 may be formed so as to remain only in the contact hole.

Next, the source pad 17 is formed so as to be embedded in the contact hole. A portion of a metal layer deposited to form the source pad 17 may be used as a gate pad. In the rear surface of the n$^+$-type silicon carbide substrate 1, a metal film of a nickel (Ni) film, a titanium (Ti) film, etc. is formed in a contact portion of the drain electrode 18 using sputtering deposition. The metal film may be a combination of stacked Ni films, Ti films. Thereafter, annealing such as rapid thermal annealing (RTA) is performed so as to convert the metal layer into a silicide and form an ohmic contact. Thereafter, for example, a thick film such as a stacked film formed by sequentially stacking a Ti film, a Ni film, and a gold (Au) film is formed by electron beam (EB) deposition, etc. to form the drain electrode 18.

In the epitaxial growth and ion implantation described above, as the n-type impurity (n-type-dopant), for example, nitrogen (N) and/or phosphorus (P), which are an n-type with respect to silicon carbide, arsenic (As), antimony (Sb), etc. may be used. As the p-type impurity (p-type-dopant), for example, boron (B) and/or aluminum (Al), which are a p-type with respect to silicon carbide, gallium (Ga), indium (In), thallium (Tl), etc. may be used. Thus, the MOSFET depicted in FIG. 1 is completed.

As described above, according to the first embodiment, formation of the high-concentration implantation region by ion implantation in the p-type base region formed by epitaxial growth generates the bell-curve shaped impurity concentration profile in which the impurity concentration in the p-type base region differs in the depth direction. Additionally, formation of the high-concentration implantation region by ion implantation in the p-type base region generates partial crystal structure disorder in the p-type base region. As a result, compared to the impurity concentration profile in the depth direction for a case of a structure formed by only an epitaxial layer such as a conventional structure (refer to FIG. 24), leak current between the drain and source may be reduced to a greater extent than in a case of the uniform p-type base region. Therefore, for a product unit that includes all products (semiconductor chips) to be manufactured within a predetermined period as a single unit, defective chips having leak defects between the drain and source may be reduced and yield may be increased. All products to be manufactured within a predetermined period are all products to be manufactured within a period for completing all manufacturing processes in the semiconductor wafer surface, in each batch process of the manufacturing process, and between batch processes. In a batch process of the manufacturing process and between batch processes, adverse effects occurring according to product unit, for example, include the condition of manufacturing equipment as well as adverse effects consequent to property fluctuations caused by the lot of the semiconductor wafers. Further, when the product unit includes all products to be manufactured which are only in the semiconductor wafer surface, the yield may be further increased.

Moreover, in general, although the smaller the variations of the carrier density of the channel are, the smaller the variations of the gate threshold voltage can be made, in the epitaxial growth of the silicon carbide, control of the impurity concentration becomes difficult and variations in the carrier density of the channel increase. Therefore, in a conventional structure (refer to FIG. 24) configured by a p-type base region of only an epitaxial layer, variations in the carrier density of the channel and in the gate threshold voltage are large. In contrast, according to the first embodiment, by the formation of the high-concentration implantation region in the p-type base region, variation of the gate threshold voltage is rate limited by variation of the impurity concentration of the high-concentration implantation region having a higher impurity concentration than the p-type base region. Deviation of the impurity concentration of the high-concentration implantation region formed by ion implantation is much smaller than the variation of the impurity concentration of a region formed by only epitaxial growth. Therefore, by the formation of the high-concentration implantation region in the p-type base region, variation of the gate threshold voltage may be made smaller than that of the convention structure configured by a p-type base region formed only by epitaxial growth. Further, according to the first embodiment, the p-type silicon carbide layer formed by epitaxial growth functions as a p-type base region whereby, a channel of favorable crystallinity is obtained from the characteristics of the epitaxial layer and lower on-resistance consequent to high carrier mobility is enabled.

Further, according to the first embodiment, even when a commercial silicon carbide base is used on which a p-type silicon carbide layer is formed by epitaxial growth on an n-type silicon carbide substrate to become the p-type base region, the same effects described above are obtained by forming the high-concentration implantation region by ion implantation in the p-type base region.

Figure 15:
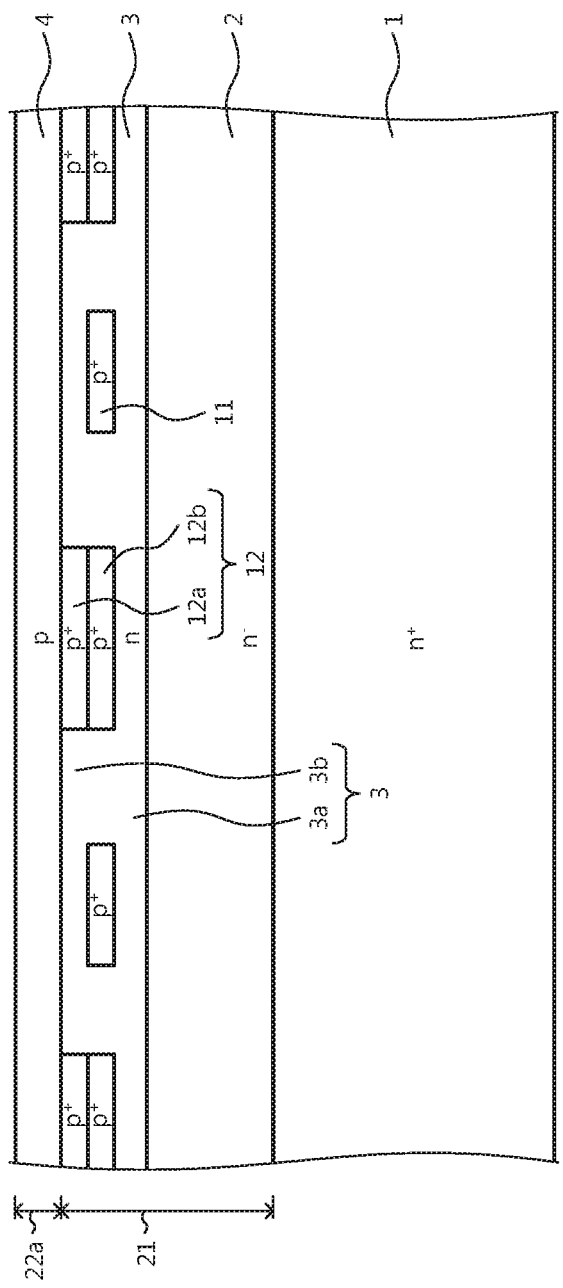
FIGS. 15, 16, and 17 are cross-sectional views of the semiconductor device according to a second embodiment during manufacture.
Figure 16:
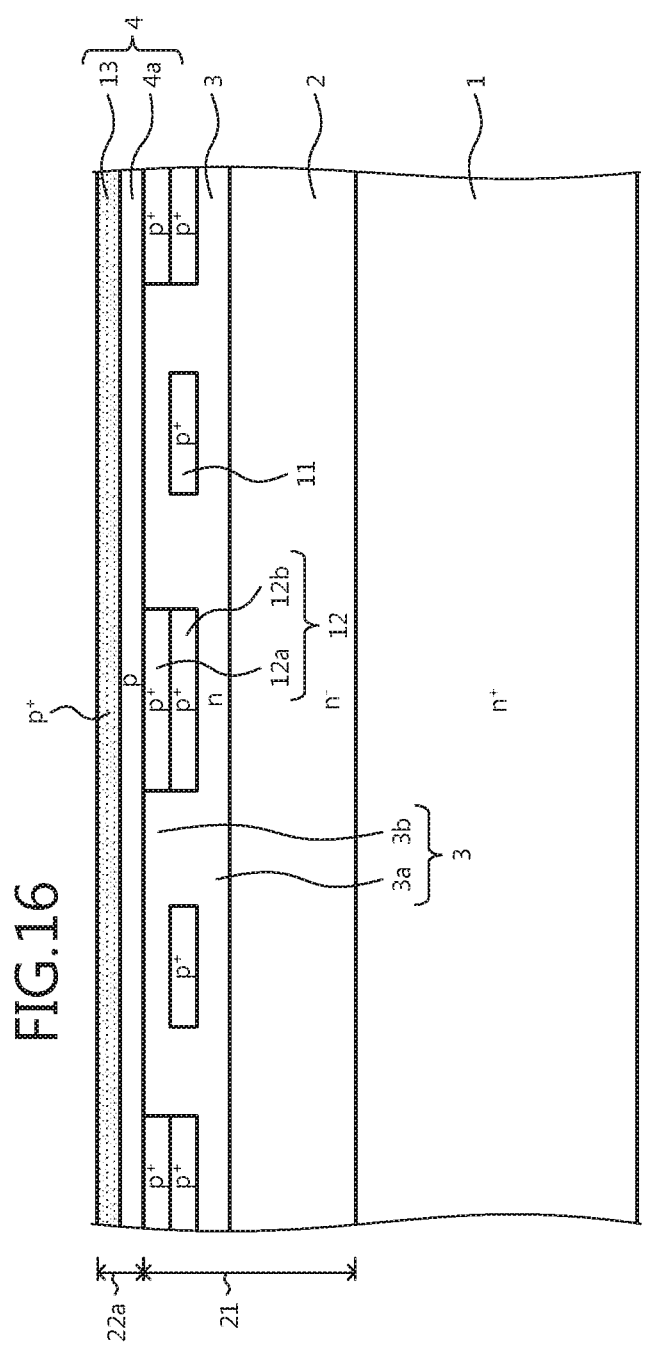
Figure 17:
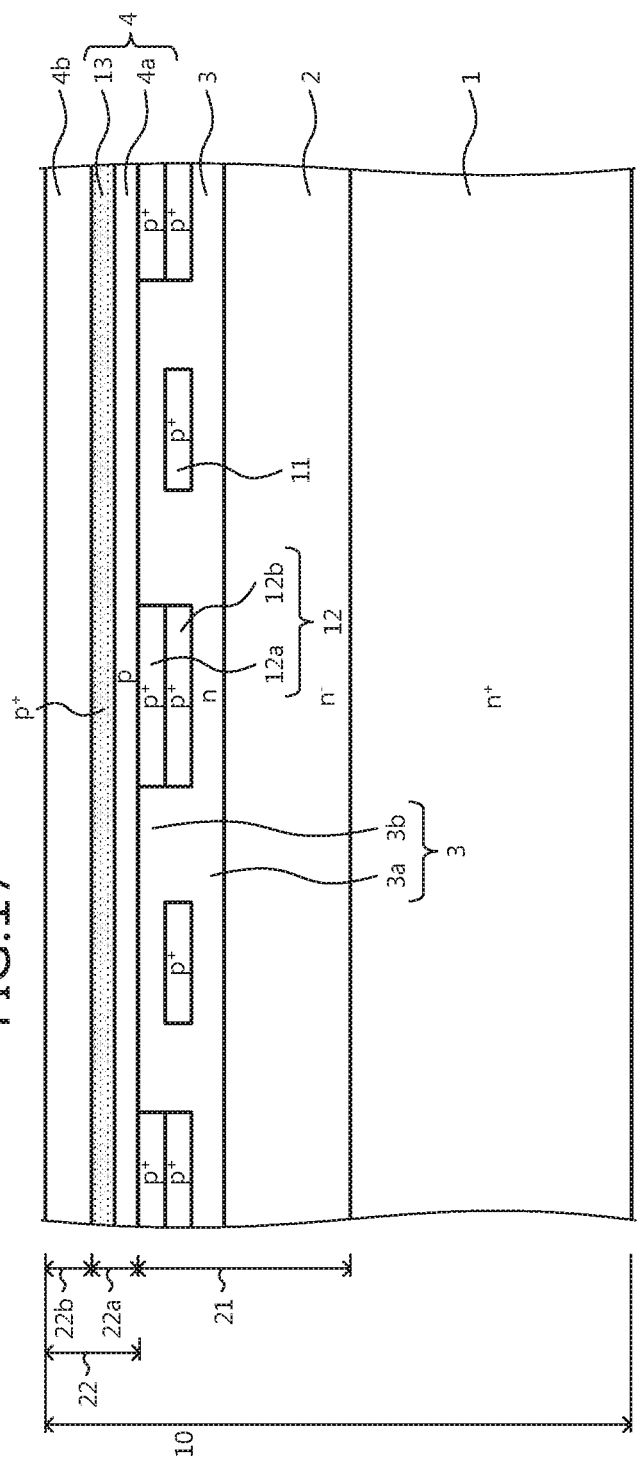

A method of manufacturing a silicon carbide semiconductor device according to a second embodiment will be described. FIGS. 15, 16, and 17 are cross-sectional views of the semiconductor device according to the second embodiment during manufacture. The structure of the semiconductor device according to the second embodiment is the same as that of the first embodiment (refer to FIGS. 1 and 2). The method of manufacturing a silicon carbide semiconductor device according to the second embodiment differs from the method of manufacturing a silicon carbide semiconductor device according to the first embodiment in the process for forming the p-type base region 4. In particular, the epitaxial growth of the p-type silicon carbide layer 22 (22a, 22b) forming the p-type base region 4 is separated into two sessions straddling the ion implantation process for forming the high-concentration implantation region 13.

In particular, first, similar to the first embodiment, the n$^+$-type silicon carbide substrate 1 is prepared and the processes up to the formation process of the n-type current spreading region 3 are sequentially performed (refer to FIGS. 3 to 7). Next, as depicted in FIG. 15, a p-type silicon carbide layer (second epitaxial layer) 22a, which becomes the p-type silicon carbide layer 22 described above is formed on the n$^-$-type silicon carbide layer (first epitaxial layer) 21 by epitaxial growth. The thickness of the p-type silicon carbide layer 22a is the same thickness as the total thickness of the first p-type base portion 4a and the high-concentration implantation region 13. Next, as depicted in FIG. 16, a p-type impurity is ion implanted in the entire p-type silicon carbide layer 22a and the high-concentration implantation region 13 having the predetermined thickness t1 is formed in the entire surface layer of the p-type silicon carbide layer 22a. A portion of the p-type silicon carbide layer 22a farther on the drain side than the high-concentration implantation region 13 becomes the first p-type base portion 4a. At this time, a portion of the p-type silicon carbide layer 22a farther on the source side than the high-concentration implantation region 13 and becoming the second p-type base portion 4b may also be formed.

Next, as depicted in FIG. 17, on the p-type silicon carbide layer 22a (i.e., on the high-concentration implantation region 13), a p-type silicon carbide layer (third epitaxial layer) 22b, which becomes the p-type silicon carbide layer 22 described above is formed by epitaxial growth. The p-type silicon carbide layer 22b becomes the second p-type base portion 4b. At this time, although the p-type silicon carbide layer 22 is formed by only epitaxial growth and has a uniform impurity concentration profile in the depth direction, similar to the first embodiment, this suffices provided the high-concentration implantation region 13 has the peak 13a of impurity concentration. When the p-type silicon carbide layer 22b is formed by epitaxial growth, the impurity concentration may be controlled and an impurity concentration profile for which the impurity concentration increases by a predetermined slope in the depth direction may be formed. As a result, the p-type base region 4 constituted by the first and the second p-type base portions 4a, 4b and the high-concentration implantation region 13 is formed.

Further, by the processes up to here, the silicon carbide base (semiconductor wafer) 10 in which the n⁻-type silicon carbide layer 21 and the p-type silicon carbide layer 22 are sequentially deposited on the n⁺-type silicon carbide substrate 1 is formed. Thereafter, similar to the first embodiment, the processes including the formation process of the n⁺-type source region 5 and subsequent processes are sequentially performed (refer to FIGS. 10 to 14) whereby, the MOSFET depicted in FIG. 1 is completed.

As described above, according to the second embodiment, effects identical to those of the first embodiment may be obtained. Further, conventionally, in performing ion implantation so that the impurity reaches a deep position from the ion implantation surface, for example, problems arise in that specialized manufacturing equipment capable of ion implantation (mega-implantation) by high acceleration energy is necessary, the ion implantation is time-consuming, etc. In contrast, according to the second embodiment, the epitaxial growth is divided into and performed in multiple sessions and based on each p-type silicon carbide layer thickness, the depth of the position of the high-concentration implantation region may be determined freely. As a result, without the use of specialized manufacturing equipment capable of mega-implantation, the high-concentration implantation region may be formed in the base region, at a deep position from the base front surface side.

Figure 18:
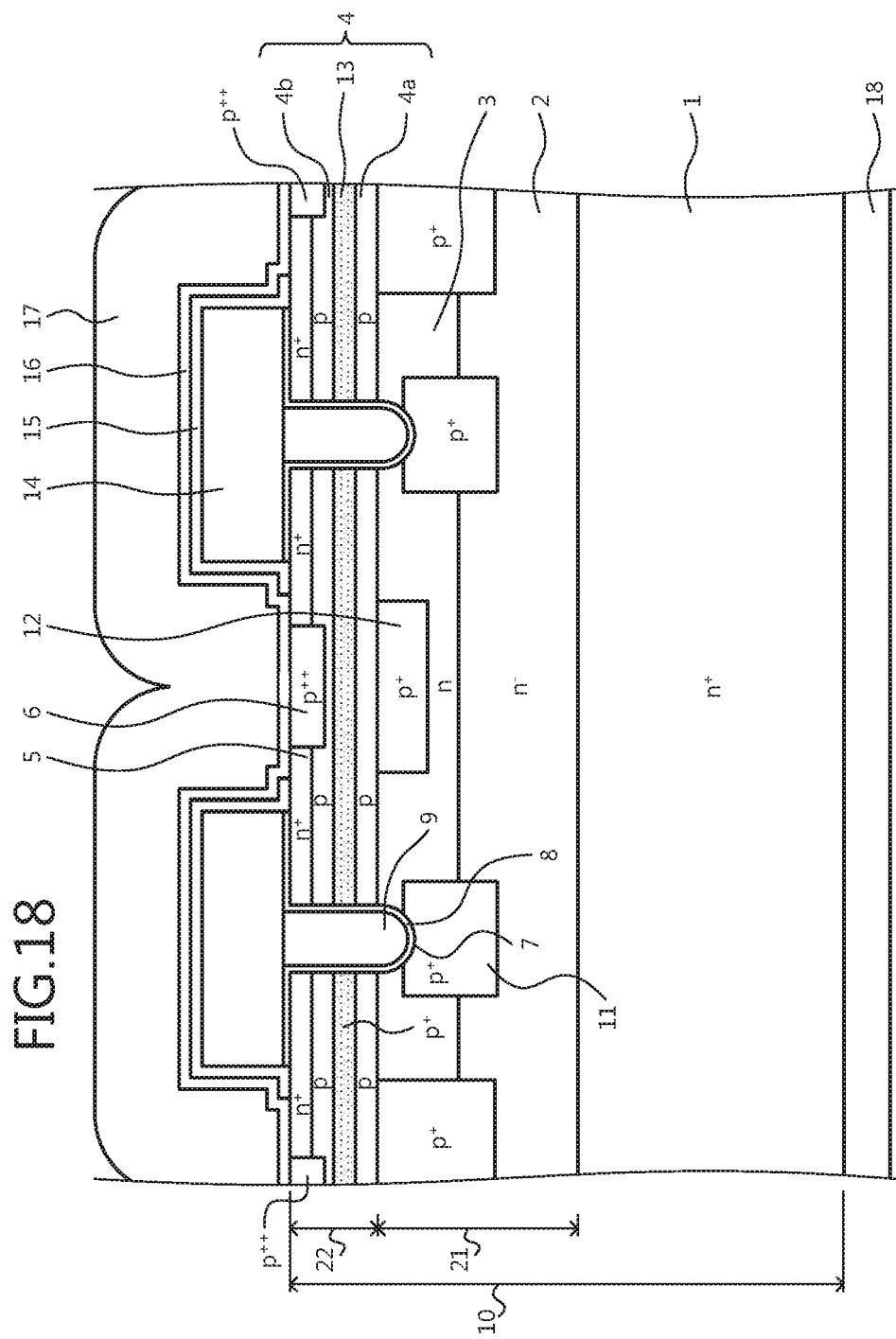
FIG. 18 is a cross-sectional view of a structure of the semiconductor device according to a third embodiment.

The structure of the semiconductor device according to a third embodiment will be described. FIG. 18 is a cross-sectional view of a structure of the semiconductor device according to the third embodiment. The semiconductor device according to the third embodiment differs from the semiconductor device according to the first embodiment in that the first and the second p⁺-type regions 11, 12 are provided at a depth reaching farther on the drain side than the interface of the n-type current spreading region 3 and the n⁻-type drift region 2.

In particular, the first p⁺-type region 11 penetrates the n-type current spreading region 3 from the bottom of the trench 7 in the depth direction and protrudes into the n⁻-type drift region 2. The second p⁺-type region 12 penetrates the n-type current spreading region 3 from the interface of the p-type base region 4 and the n-type current spreading region 3 in the depth direction and protrudes into the n⁻-type drift region 2. The depth of the position of the drain-side ends of the first and the second p⁺-type regions 11, 12 may be the same as that of the interface of the n-type current spreading region 3 and the n⁻-type drift region 2.

The method of manufacturing a silicon carbide semiconductor device according to the third embodiment suffices to make, in the method of manufacturing a silicon carbide semiconductor device according to the first embodiment, the depth of the first p⁺-type region 11 and the depth of the p⁺-type partial region 12a, which becomes a portion of the second p⁺-type region 12, deeper than the n-type partial region 3a, which becomes a portion of the n-type current spreading region 3.

As described above, according to the third embodiment, regardless of the depths of the first and the second p⁺-type regions, effects identical to those of the first and the second embodiments may be obtained.

Figure 19:
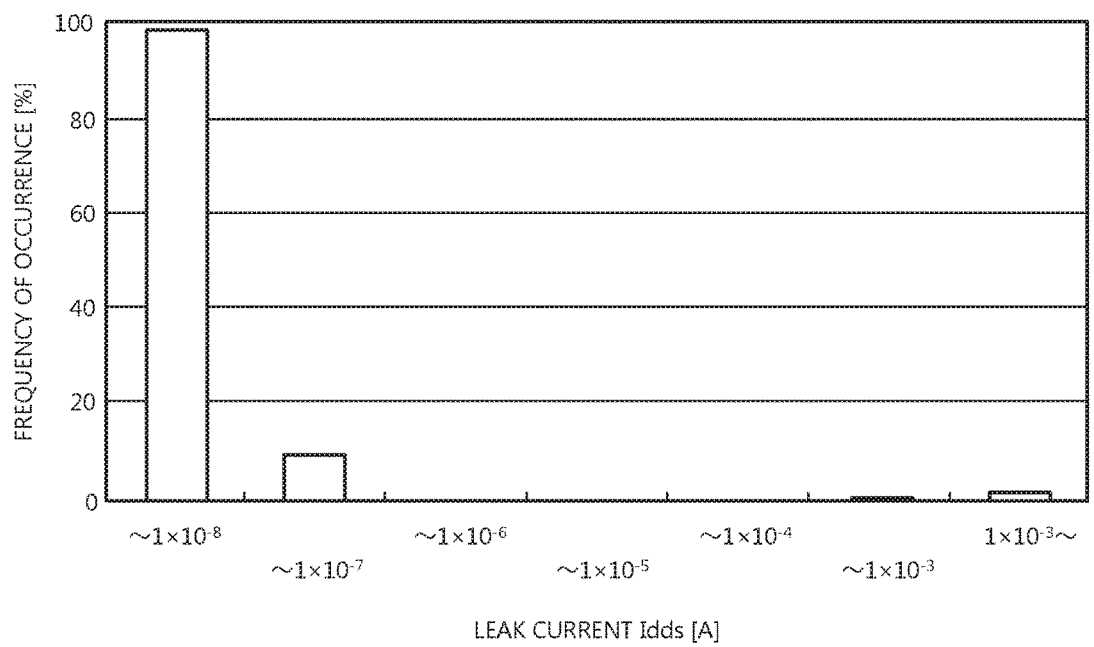
FIG. 19 is a characteristic diagram depicting a frequency of occurrence of leak current between the drain and source of the silicon carbide semiconductor device according to a first example.
Figure 20:
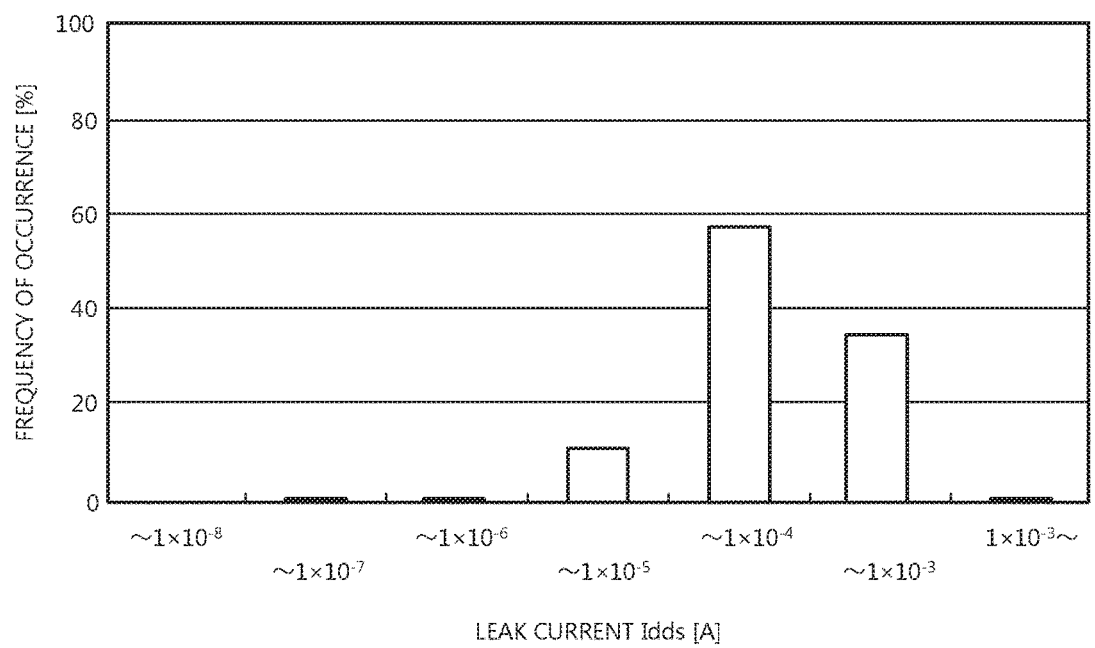
FIG. 20 is characteristic diagram depicting the frequency of occurrence of leak current between the drain and source in a conventional example of a silicon carbide semiconductor device.

The frequency of occurrence of leak current between the drain and source was verified. FIG. 19 is a characteristic diagram depicting the frequency of occurrence of leak current between the drain and source of the silicon carbide semiconductor device according to a first example. FIG. 20 is characteristic diagram depicting the frequency of occurrence of leak current between the drain and source in a conventional example of a silicon carbide semiconductor device. In FIGS. 19 and 20, the vertical axis represents the frequency of occurrence of leak current for one semiconductor wafer surface and the horizontal axis represents the magnitude (current value) of leak current Idds between the drain and source of each product (semiconductor chip) formed from one semiconductor wafer surface. On the horizontal axes in FIGS. 19 and 20, when the leak current Idds between the drain and source is $1 \times 10^{-8}$A or less, the leak current Idds is indicated as "~$1 \times 10^{-8}$A". When the leak current Idds between the drain and source is greater than $1 \times 10^{x}$A and $1 \times 10^{x+1}$A or less, the leak current Idds is indicated as "~$1 \times 10^{x+1}$A" (x=−8 to −4). When the leak current Idds between the drain and source is greater than $1 \times 10^{-3}$A, the leak current Idds is indicated as "$1 \times 10^{-3}$A~".

Plural MOSFET chips (refer to FIG. 1) having the high-concentration implantation region 13 in the p-type base region 4 were manufactured from one semiconductor wafer according to the method of manufacturing a silicon carbide semiconductor device according to the first embodiment described above (hereinafter, EXAMPLE). Plural MOSFET chips (refer to FIG. 24) of a conventional structure configured by the p-type base region 104 formed by only epitaxial growth were manufactured from one semiconductor wafer for comparison (hereinafter, first conventional example). The leak current Idds between the drain and source in plural MOSFET chips as well as in the first conventional example and EXAMPLE were measured. The results are depicted in FIGS. 19 and 20. From the results depicted in FIGS. 19 and 20, it was confirmed that in EXAMPLE, the impurity concentration profile (refer to FIG. 2) resulting from the high-concentration implantation region 13 in the p-type base region 4 is formed whereby, the frequency of occurrence of the leak current Idds between the drain and source and the magnitude of the leak current Idds may be reduced significantly to a greater extent than in the first conventional example.

Figure 21:
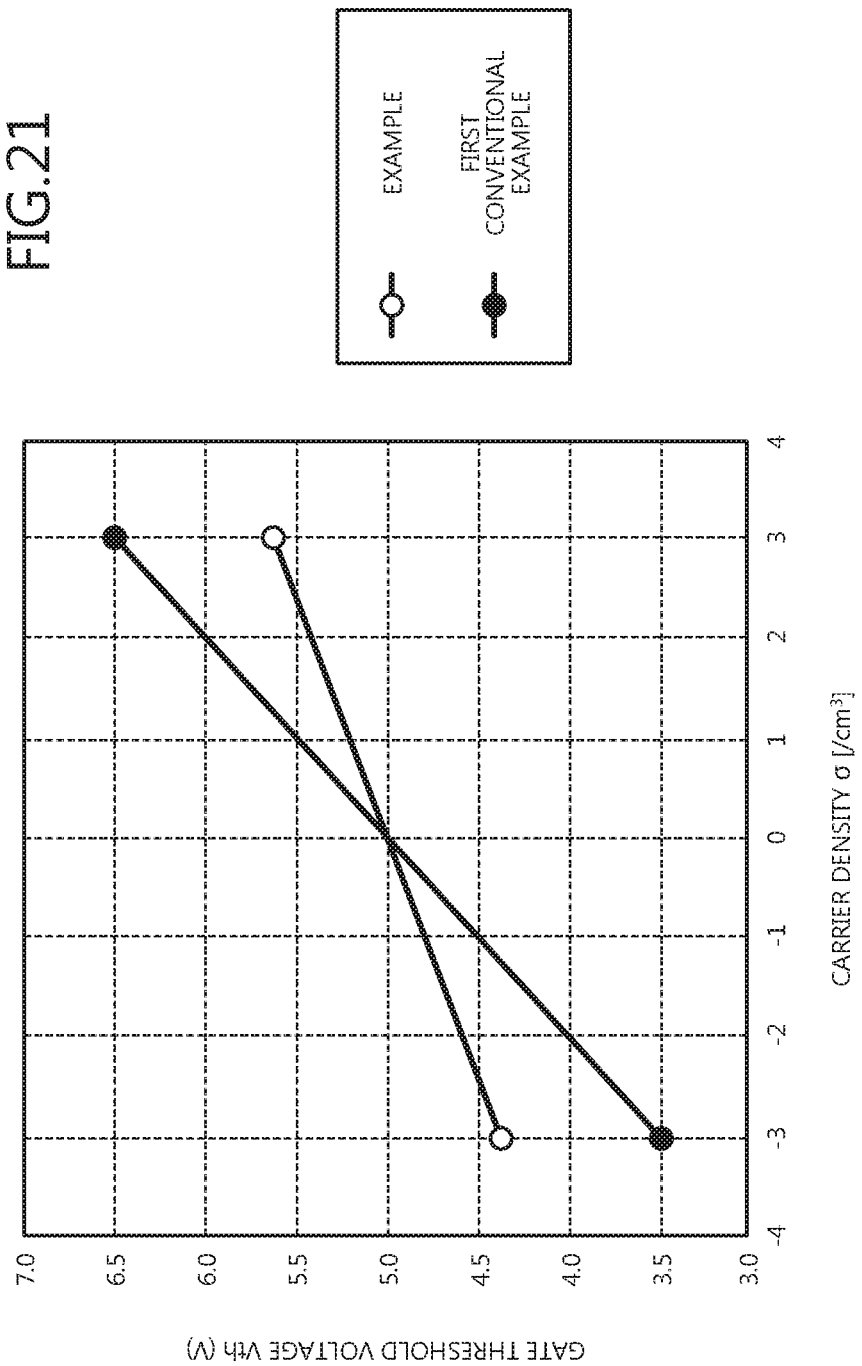
FIG. 21 is a characteristic diagram depicting variation of a gate threshold voltage Vth of the silicon carbide semiconductor device according to a second example.

Variation of the gate threshold voltage Vth was verified. FIG. 21 is a characteristic diagram depicting variation of the gate threshold voltage Vth of the silicon carbide semiconductor device according to a second example. In FIG. 21, the horizontal axis represents standard deviation σ of the variation of channel carrier density and the vertical axis represents variation of the gate threshold voltage Vth in the case of design where the gate threshold voltage Vth=5V. Results of measurement of variation of the gate threshold voltage Vth in EXAMPLE and the first conventional example described above are depicted in FIG. 21.

From the results depicted in FIG. 21, it was confirmed that in the first conventional example, for one semiconductor wafer surface, variation of the impurity concentration of the p-type base region 104 within a standard deviation of ±3σ of the mean value was ±30%. Further, it was confirmed that the gate threshold voltage Vth within a standard deviation of ±3σ of the mean value varied in a range from 3.5V to 6.5V.

On the other hand, in EXAMPLE, for one semiconductor wafer surface, although variation of the impurity concentration of the p-type base region 4 within a standard deviation of ±3σ of the mean was ±30%, the same as the first conventional example, variation of the impurity concentration of the high-concentration implantation region 13 was confirmed to be ±10%. Further, it was confirmed that the gate threshold voltage Vth within a standard deviation of ±3σ of the mean could be controlled to be within a range from 4.4V to 5.6V. Therefore, it was confirmed that by the formation of the high-concentration implantation region 13 in the p-type base region 4, variation of the gate threshold voltage Vth is rate-limited by the variation of the impurity concentration of the high-concentration implantation region 13.

Figure 22A:
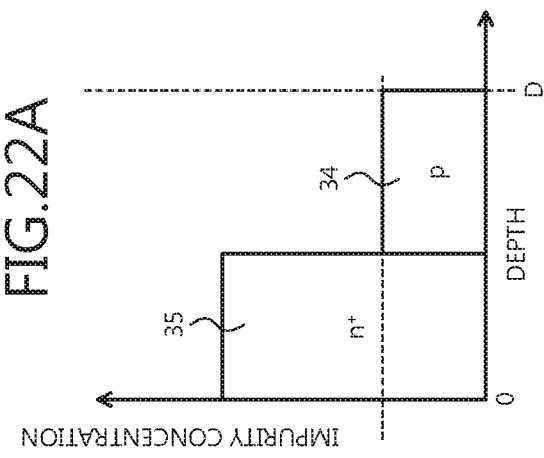
FIGS. 22A, 22B, and 22C are diagrams depicting conditions of a p-type base region of the silicon carbide semiconductor devices of first and second comparison examples.
Figure 22B:
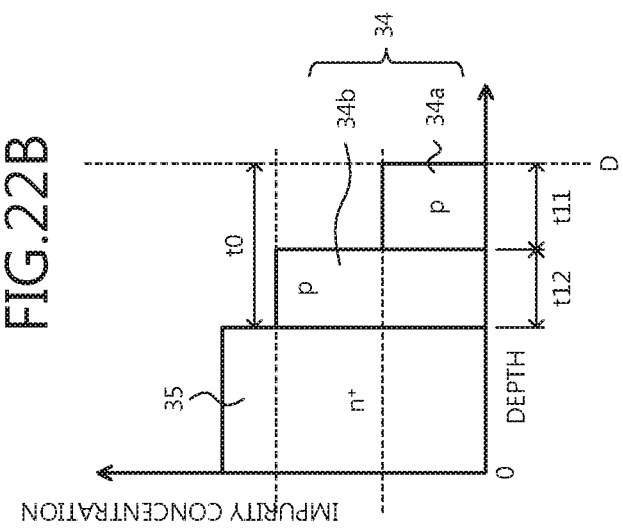
Figure 22C:
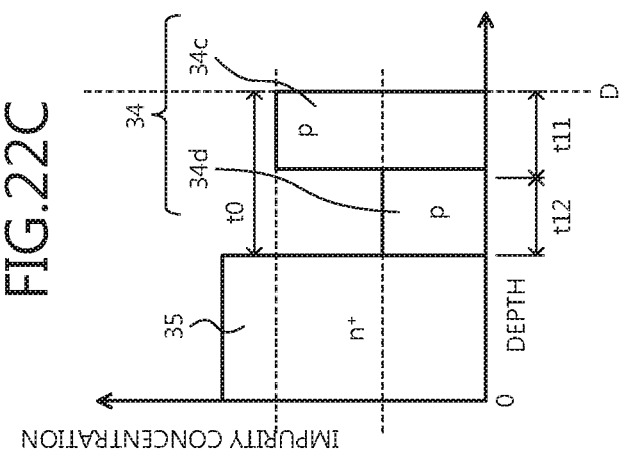
Figure 23:
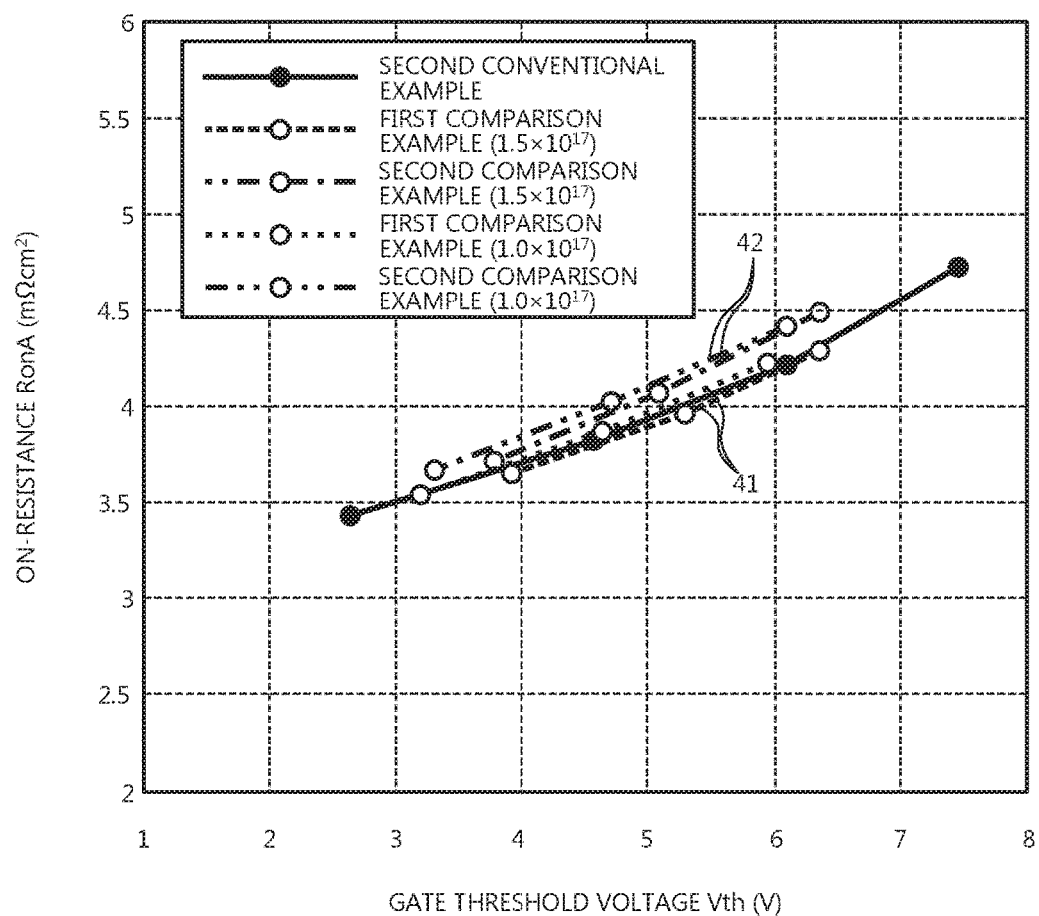
FIG. 23 is a characteristics diagram depicting relationships of the gate threshold voltage Vth and on-resistance in the first and second comparison examples.

The optimal depth of the position of the peak 13a of the high-concentration implantation region 13 was verified. FIGS. 22A, 22B, and 22C are diagrams depicting conditions of the p-type base region of the silicon carbide semiconductor devices of first and second comparison examples. In FIGS. 22A, 22B, and 22C, the horizontal axis is the depth from the base front surface and the vertical axis is impurity concentration. In FIGS. 22A, 22B, and 22C, depth=0 μm is an interface of a source electrode (not depicted) and an n$^+$-type source region 35. FIGS. 22A, 22B, and 22C are characteristic diagrams depicting the relationships of the gate threshold voltage Vth and on-resistance of the silicon carbide semiconductor devices of the first and second comparison examples. Results of simulation of the relationships of the gate threshold voltage Vth and on-resistance (RonA) in the second conventional example and the first and second comparison examples are depicted in FIG. 23.

In the second conventional example and the first and second comparison examples, the carrier mobility of the channel and the channel dependency of the gate threshold voltage Vth each differ and therefore, were qualitatively evaluated. For the second conventional example and the first and second comparison examples, the carrier mobility of the channel was assumed for a case where the carrier mobility of the channel was set to be 2.0×10$^{17}$/cm$^3$. Since respective subthreshold current values also differed for the second conventional example and the first and second comparison examples, the gate threshold voltage Vth was also qualitatively evaluated. Cell pitch (arrangement interval of unit cells) was set as 6.0 μm and the drain voltage Vd was set to be 20V.

Conditions of the second conventional example and the first and second comparison examples were as follows. As depicted in FIG. 22A, the second conventional example includes a p-type base region 34 having an impurity concentration profile that is uniform in the depth direction. A thickness t0 of the p-type base region 34 was set to be 0.55 μm and a depth D of an interface of the p-type base region 34 and an n-type current spreading region (not depicted), from the base front surface was set to be 1.1 μm. FIG. 23 depicts calculation results of on-resistance values when the gate threshold voltage Vth is variously changed by respective conditions where the impurity concentration of the p-type base region 34 is assumed to be 1.5×10$^{17}$/cm$^3$, 2.0×10$^{17}$/cm$^3$, 2.5×10$^{17}$/cm$^3$, and 3.0×10$^{17}$/cm$^3$.

As depicted in FIG. 22B, the first comparison example differs from the second conventional example in that in the p-type base region 34, the impurity concentration of a portion (hereinafter, second portion) 34b on the source side is made higher than that of a portion on the drain side (hereinafter, first portion) 34a. FIG. 23 depicts calculation results of on-resistance values when the gate threshold voltage Vth is variously changed by respective conditions where the impurity concentration of the second portion 34b of the p-type base region 34 is assumed to be 2.0×10$^{17}$/cm$^3$, 2.5×10$^{17}$/cm$^3$, and 3.0×10$^{17}$/cm$^3$. Further, FIG. 23 depicts cases where the impurity concentration of the first portion 34a of the p-type base region 34 is 1.0×10$^{17}$/cm$^3$ and 1.5×10$^{17}$/cm$^3$.

As depicted in FIG. 22C, the second comparison example differs from the second conventional example in that in the p-type base region 34, the impurity concentration of a portion on the source side (hereinafter, second portion) 34d is made lower than that of a portion on the drain side (hereinafter, first portion) 34c. FIG. 23 depicts calculation results of on-resistance values when the gate threshold voltage Vth is variously changed by respective conditions where the impurity concentration of the first portion 34c of the p-type base region 34 is assumed to be 2.0×10$^{17}$/cm$^3$, 2.5×10$^{17}$/cm$^3$, and 3.0×10$^{17}$/cm$^3$. Further, FIG. 23 depicts cases where the impurity concentration of the second portion 34d of the p-type base region 34 is 1.0×10$^{17}$/cm$^3$ and 1.5×10$^{17}$/cm$^3$.

In both the first and second comparison examples, thicknesses t11, t12 of the first and second portions of the p-type base region 34 were the same, 0.275 μm. Further, in both the first and second comparison examples, although the impurity concentration profile of the p-type base region 34 is changed to have a step-shape in the depth direction, the high-impurity-concentration second and first portions 34b, 34c are assumed to have impurity concentration profiles having a Gaussian distribution formed consequent to ion implantation. In other words, the second and first portions 34b, 34c of the p-type base region 34 in the first and second comparison examples assume the high-concentration implantation region 13 of the present invention.

From the results depicted in FIG. 23, it was confirmed that in the first comparison example (segment indicated by broken lines 41), on-resistance characteristics comparable to the second conventional example could be maintained. In other words, the results illustrate that in the present invention, the high-concentration implantation region 13 may be preferably arranged at a depth position that is as close to the n$^+$-type source region 5 as possible. On the other hand, in the second comparison example (segment indicated by single-dot/dashed line and double-dot/dashed line 42), it was confirmed that when the conditions of the gate threshold voltage Vth are the same, on-resistance becomes higher than in the second conventional example. Therefore, the results illustrate that in the present invention, it is favorable for the depth of position of the peak 13a to be set such that the high-concentration implantation region 13 is at a depth position not reaching the depth of the interface of the p-type base region 4 and the n-type current spreading region 3, from the base front surface (i.e., a depth shallower than the second comparison example). In the EXAMPLE, although simulation results for a case where the cell pitch is 6 μm are depicted, even when, for example, the cell pitch is from 1.5 μm to 10 μm, the same effects are obtained.

In the first to third examples, although a case where aluminum is used as the p-type-dopant (p-type impurity) forming the p-type base region 4 and the high-concentration implantation region 13 is described as an example, the p-type-dopant is not limited hereto and even when a p-type-dopant above becoming a p-type with respect to silicon carbide is used, the same effects are obtained. Further, even when the p-type-dopant used when the p-type base region 4 is formed by epitaxial growth and the p-type-dopant used when the high-concentration implantation region 13 is formed by ion implantation are different ion species, the same effects are obtained.

Figure 25:
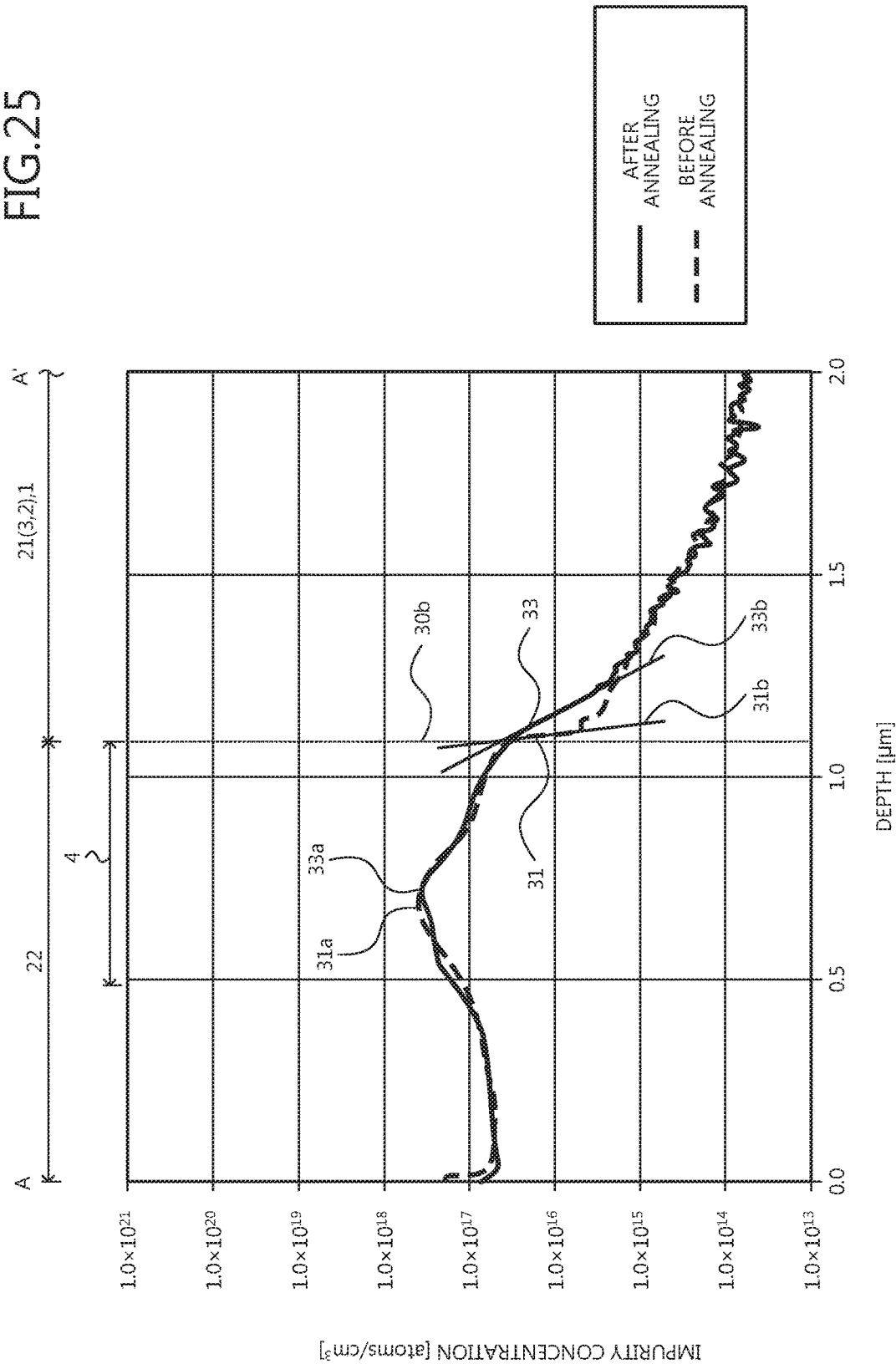
FIG. 25 is a characteristics diagram depicting a p-type impurity concentration profile of constituent parts in FIG. 1.
Figure 26:
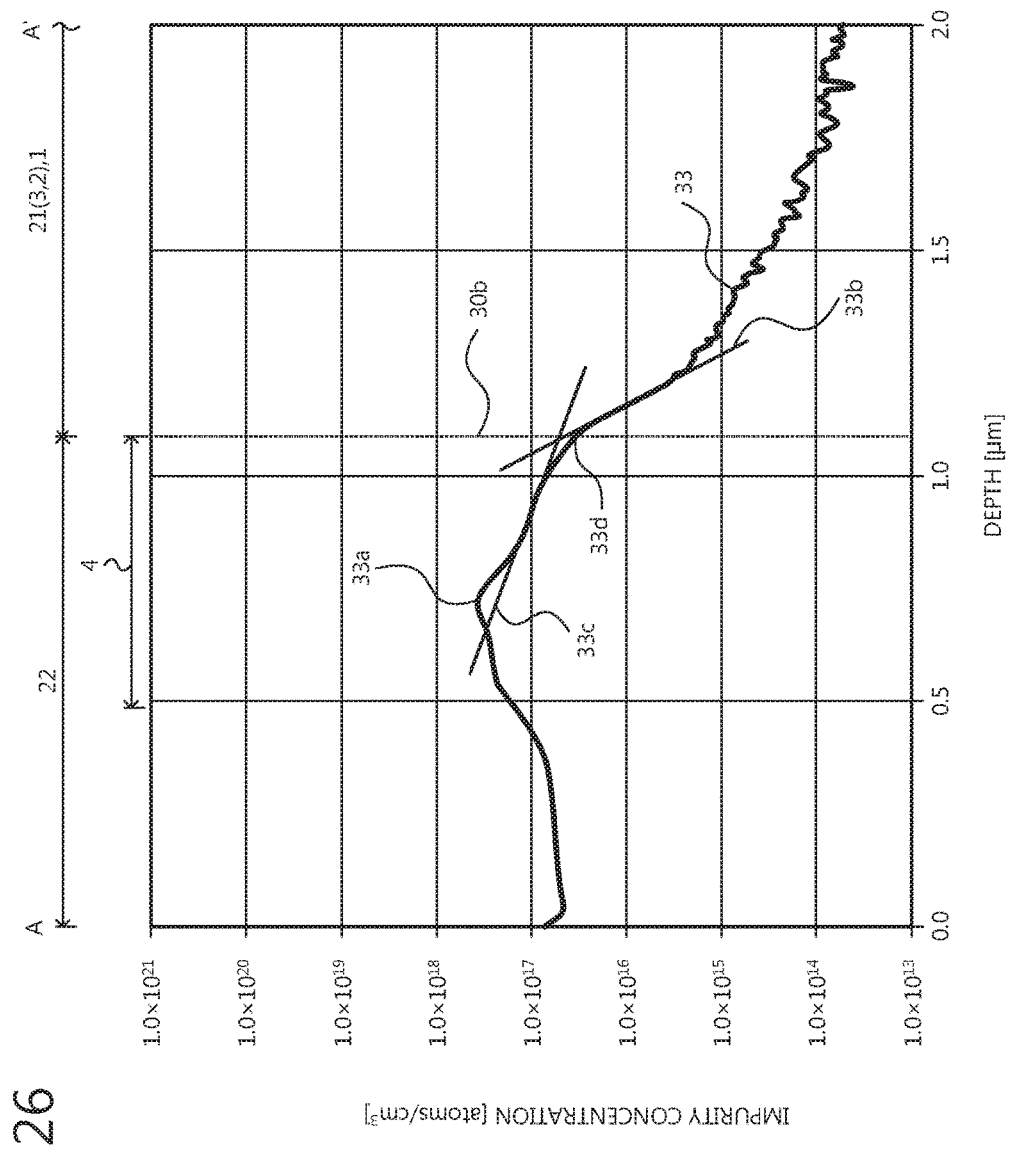
FIG. 26 is a diagram depicting conditions of the p-type impurity concentration profile of the constituent parts in FIG. 1.

A post-annealing state of the p-type impurity concentration profile 31 (refer to FIG. 2) resulting from the ion implantation of a p-type impurity for forming the high-concentration implantation region 13 in a fourth embodiment will be described. FIG. 25 is a characteristics diagram depicting a p-type impurity concentration profile of constituent parts in FIG. 1. FIG. 26 is a diagram depicting conditions of the p-type impurity concentration profile of the constituent parts in FIG. 1. FIG. 25 depicts the p-type impurity concentration profile 31 (similarly for FIG. 2) before annealing, and a p-type impurity concentration profile 33 of the same portion after annealing. FIG. 26 depicts the p-type impurity concentration profile 33 after annealing. Here, annealing is all heat treatment performed after the ion implantation for forming the high-concentration implantation region 13 until product completion.

As depicted in FIGS. 25 and 26, in the p-type impurity concentration profile 33 after annealing, an impurity concentration slope (hereinafter, lower-stage slope (second impurity concentration slope)) 33b of a sharp decrease on the drain side from the interface 30b of the p-type silicon carbide layer 22 and the n⁻-type silicon carbide layer 21 is more gradual than a corresponding lower-stage slope 31b before annealing. The more annealing is performed, the more gradual the lower-stage slope 33b of the p-type impurity concentration profile 33 becomes compared to the lower-stage slope 31b of the p-type impurity concentration profile 31 before annealing. The sharp decrease of the impurity concentration is, relative to the gradual impurity concentration slope (hereinafter, upper-stage slope (first impurity concentration slope)) 33c resulting from ion implantation, a large ratio (slope) of impurity concentration decrease to a unit depth toward the drain side.

The upper-stage slope 33c is the impurity concentration slope of a portion in the p-type impurity concentration profile 33 where the impurity concentration on the drain side decreases between a peak 33a of the impurity concentration and the interface 30b of the p-type silicon carbide layer 22 and the n⁻-type silicon carbide layer 21. The upper-stage slope 33c and the lower-stage slope 33b are contiguous at an impurity concentration point 33d on the interface 30b of the p-type silicon carbide layer 22 and the n⁻-type silicon carbide layer 21 as a vertex forming a substantially convex impurity concentration profile. A magnitude relation of the upper-stage slope 33c and the lower-stage slope 33b is maintained to be the same before and after annealing. In other words, in the p-type impurity concentration profile 33 after annealing, on the drain side of the upper-stage slope 33c, the lower-stage slope 33b where the impurity concentration decreases sharply compared to the upper-stage slope 33c is formed similarly to before annealing.

In this way, the upper-stage slope 33c and the lower-stage slope 33b are formed in the p-type impurity concentration profile 33 after annealing and the lower-stage slope 33b where the impurity concentration decreases more sharply on the drain side than the upper-stage slope 33c is formed, enabling short channel effect to be suppressed. As a result, the tradeoff between reduction of the variation of the gate threshold voltage Vth and reduction of on-resistance (RonA) is improved. Further, during drain voltage application, the spread of a depletion layer from a pn junction between the p-type base region 4 and the n⁻-type drift region 2 toward the n⁻-type drift region 2 side may be suppressed whereby, degradation consequent to drain voltage application may be suppressed.

The method of manufacturing a silicon carbide semiconductor device according to the fourth embodiment may be produced by the method of manufacturing a silicon carbide semiconductor device according to the second embodiment. Further, the fourth embodiment may be applied to the third embodiment.

As described above, according to the fourth embodiment, application to the first to third embodiments is possible.

In the description above, various changes not departing from the spirit of the present invention are possible. In the described embodiments, for example, dimensions, impurity concentrations, etc. of components may be variously set according to required specifications, etc. Further, in the described embodiments, although a MOSFET is described as an example, without limitation hereto, various silicon carbide semiconductor devices conducting and blocking current by gate driving control based on a predetermined gate threshold voltage are widely applicable. A gate-driving-controlled silicon carbide semiconductor device, for example, may be an insulated gate bipolar transistor (IGBT) or the like. Further, in the described embodiments, although a case where silicon carbide is used as a wide bandgap semiconductor is described as an example, a wide bandgap semiconductor other than silicon carbide, for example, gallium nitride (GaN) and the like may be used. In the described embodiments, a first conductivity type is assumed to be an n-type and a second conductivity type is assumed to be a p-type; however, the present invention is further valid when the first conductivity type is a p-type and the second conductivity type is an n-type. In this case, in an n-type base region, an n⁺-type high-concentration implantation region is formed having an impurity concentration profile identical to the p-type impurity concentration profile in FIG. 2 by ion implantation.

On the contrary, in the described conventional structure, although a channel having favorable crystallinity is obtained by forming the p-type base region 104 by epitaxial growth and reduced on-resistance is possible by high carrier mobility, control of the impurity concentration during epitaxial growth of the silicon carbide layer is extremely difficult. Variation of the impurity concentration by current epitaxial growth techniques is ±30% for a product unit (including a semiconductor wafer surface, each batch process of the manufacturing process, and between batch processes) that includes all products to be manufactured within a predetermined period as a single unit. When the variation of the p-type impurity concentration of the p-type base region 104 is ±30%, a problem arises in that the variation of the gate threshold voltage Vth increases. Further, when a vertical MOSFET of a trench gate structure is manufactured (produced), a problem arises in that defective chips that are defective consequent to leak current between the drain and source (hereinafter, leak defect) increase and yield decreases.

The silicon carbide semiconductor device and the method of manufacturing a silicon carbide semiconductor device according to the present invention enable variation of the gate threshold voltage to be reduced while maintaining low on-resistance. Additionally, an effect is achieved in that leak defects may be reduced and yield may be increased.

As described, the silicon carbide semiconductor device and the method of manufacturing a silicon carbide semiconductor device according to the present invention are useful for, for example, semiconductor devices used in power converting equipment such as converters and inverters, and power supply devices such as in various industrial machines and are particularly suitable for silicon carbide semiconductor devices of a trench gate structure.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device comprising:
   a first epitaxial layer of a first conductivity type, formed on a front surface of a silicon carbide substrate;
   a second epitaxial layer of a second conductivity type, formed on an opposite side of the first epitaxial layer from the silicon carbide substrate;
   a first semiconductor region of the second conductivity type, selectively formed in the second epitaxial layer, the first semiconductor region having an impurity concentration higher than that of the second epitaxial layer;
   a second semiconductor region of the first conductivity type, selectively formed in the second epitaxial layer, at a position shallower than the first semiconductor region;
   a trench that penetrates the second semiconductor region, the first semiconductor region, and the second epitaxial layer, and reaches the first epitaxial layer;
   a gate insulating film provided in the trench;
   a gate electrode provided in the trench, and surrounded in the trench by the gate insulating film;
   a first electrode that contacts the second semiconductor region and the second epitaxial layer; and
   a second electrode provided on a rear surface of the silicon carbide substrate,
   wherein the first semiconductor region has a second-conductivity-type impurity concentration profile in which concentration differences in a depth direction form a bell-shaped curve at a peak of impurity concentration higher than that of the second epitaxial layer, and
   wherein the second epitaxial layer has a first-conductivity-type impurity concentration profile and a second-conductivity-type impurity concentration profile such that a channel formed along a side wall of the trench during an ON state of the silicon carbide semiconductor device has a channel length of at least 0.3 μm and at most 1 μm.

2. The silicon carbide semiconductor device according to claim 1, wherein
   in the second-conductivity-type impurity concentration profile, the impurity concentration sharply decreases at a border of the second epitaxial layer and the first epitaxial layer.

3. The silicon carbide semiconductor device according to claim 2,
   wherein the second-conductivity-type impurity concentration profile has:
   a first impurity concentration slope where the impurity concentration decreases between the peak and a border of the second epitaxial layer and first epitaxial layer, on a first epitaxial layer side, and
   a second impurity concentration slope where the impurity concentration decreases from the border of the second epitaxial layer and the first epitaxial layer, on the first epitaxial layer side, and
   the second impurity concentration slope is greater than the first impurity concentration slope.

4. The silicon carbide semiconductor device according to claim 3,
   wherein in the second-conductivity-type impurity concentration profile, the impurity concentration sharply decreases at the border of the second epitaxial layer and the first epitaxial layer, by the second impurity concentration slope.

5. The silicon carbide semiconductor device according to claim 1, wherein
   the peak of impurity concentration in the second-conductivity-type impurity concentration profile is positioned farther on a first electrode side than the border of the second epitaxial layer and the first epitaxial layer.

6. The silicon carbide semiconductor device according to claim 1, wherein
   the first semiconductor region is provided uniformly in a direction parallel to the front surface of the silicon carbide substrate.

7. The silicon carbide semiconductor device according to claim 1, comprising
   a third semiconductor region of the first conductivity type, formed in the first epitaxial layer, the third semiconductor region having an impurity concentration higher than that of the first epitaxial layer, wherein
   the third semiconductor region contacts the second epitaxial layer and, from a border with the second epitaxial layer, reaches a position deeper on a second electrode side than the trench.

8. The silicon carbide semiconductor device according to claim 7, further comprising
   a fourth semiconductor region of the second conductivity type, selectively formed in the third semiconductor region, the fourth semiconductor region covering a bottom of the trench.

9. The silicon carbide semiconductor device according to claim 8, wherein
   the fourth semiconductor region penetrates the third semiconductor region from the bottom of the trench.

10. The silicon carbide semiconductor device according to claim 7, further comprising
    a fifth semiconductor region of the second conductivity type, formed in the third semiconductor region between the trench and an adjacent trench so as to contact the second epitaxial layer.

11. The silicon carbide semiconductor device according to claim 10, wherein the fifth semiconductor region penetrates the third semiconductor region in the depth direction.

12. The silicon carbide semiconductor device according to claim 1,
wherein at least a portion of the gate insulating film along a side wall of the trench has a thickness that is 50 nm or more and 100 nm or less, and
the impurity concentration of the peak in the second-conductivity-type impurity concentration profile is $3 \times 10^{17}$ atoms/cm$^3$ or more and $5 \times 10^{17}$ atoms/cm$^3$ or less.

13. The silicon carbide semiconductor device according to claim 1, wherein the impurity concentration of the peak in the second-conductivity-type impurity concentration profile is at least two times the impurity concentration of the second epitaxial layer.

14. A method of manufacturing a silicon carbide semiconductor device, the method comprising forming a first epitaxial layer of a first conductivity type on a front surface of a silicon carbide substrate;
forming a second epitaxial layer of a second conductivity type on the first epitaxial layer;
selectively forming a first semiconductor region of the second conductivity type by ion implantation in the second epitaxial layer, the first semiconductor region having an impurity concentration higher than that of the second epitaxial layer;
selectively forming a second semiconductor region of the first conductivity type in the second epitaxial layer, at a position shallower than the first semiconductor region;
forming a trench to penetrate the second semiconductor region, the first semiconductor region, and the second epitaxial layer, and reach the first epitaxial layer;
forming a gate electrode in the trench, via a gate insulating film;
forming a first electrode contacting the second semiconductor region and the second epitaxial layer; and
forming a second electrode on a rear surface of the silicon carbide substrate, wherein
the first semiconductor region is formed to have a second-conductivity-type impurity concentration profile in which concentration differences in a depth direction form a bell-shaped curve at a peak of impurity concentration higher than that of the second epitaxial layer, and
wherein the second epitaxial layer is formed to have a first-conductivity-type impurity concentration profile and a second-conductivity-type impurity concentration profile such that a channel formed along a side wall of the trench during an ON state of the silicon carbide semiconductor device has a channel length of at least 0.3 µm and at most 1 µm.

15. The method of manufacturing a silicon carbide semiconductor device according to claim 14, wherein
the ion implantation is performed using an accelerating voltage so that the peak of the impurity concentration in the second-conductivity-type impurity concentration profile is formed at a position deeper than an ion implantation surface.

16. The method of manufacturing a silicon carbide semiconductor device according to claim 14, comprising
forming a third epitaxial layer of the second conductivity type on the second epitaxial layer after forming the first semiconductor region and before forming the second semiconductor region.

17. The method of manufacturing a silicon carbide semiconductor device according claim 16, wherein
the ion implantation is performed using an accelerating voltage so that the peak of the impurity concentration in the second-conductivity-type impurity concentration profile is formed at a position equal to or deeper than an ion implantation surface.

18. The method of manufacturing a silicon carbide semiconductor device according to claim 14, wherein
the ion implantation is performed using an accelerating voltage so that the peak of the impurity concentration in the second-conductivity-type impurity concentration profile is formed at a depth position farther on a first electrode side than a border of the second epitaxial layer and the first epitaxial layer.

19. The method of manufacturing a silicon carbide semiconductor device according to claim 14, wherein in forming the first semiconductor region, the impurity concentration of the peak in the second-conductivity-type impurity concentration profile is two times the impurity concentration of the second epitaxial layer or more.

20. The method of manufacturing a silicon carbide semiconductor device according to claim 14, wherein
in forming the gate electrode, at least a portion of the gate insulating film along a side wall of the trench has a thickness that is 50 nm or more and 100 nm or less, and
in forming the first semiconductor region, the impurity concentration of the peak in the second-conductivity-type impurity concentration profile is $3 \times 10^{17}$ atoms/cm$^3$ or more and $5 \times 10^{17}$ atoms/cm$^3$ or less.

* * * * *